US009543957B2

United States Patent
Oda

(10) Patent No.: US 9,543,957 B2
(45) Date of Patent: Jan. 10, 2017

(54) RECONFIGURABLE LOGIC CIRCUIT DEVICE

(71) Applicant: KABUSHIKI KAISHBA TOSHIBA, Tokyo (JP)

(72) Inventor: Masato Oda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/927,125

(22) Filed: Oct. 29, 2015

(65) Prior Publication Data

US 2016/0065218 A1    Mar. 3, 2016

Related U.S. Application Data

(63) Continuation of application No. PCT/JP2014/069432, filed on Jul. 23, 2014.

(30) Foreign Application Priority Data

Jul. 24, 2013  (JP) ................... 2013-153698

(51) Int. Cl.
    *H03K 19/177* (2006.01)
    *H03K 19/173* (2006.01)
(52) U.S. Cl.
    CPC ...... *H03K 19/1776* (2013.01); *H03K 19/1733* (2013.01)
(58) Field of Classification Search
    CPC .... G11C 2213/75; G11C 13/003; H01L 27/24; H01L 27/2463; H01L 45/144; B82Y 10/00; H03K 19/17736; H03K 19/17748
    (Continued)

(56) References Cited

U.S. PATENT DOCUMENTS

| 7,193,437 | B2 | 3/2007 | Cappelli et al. |
| 7,414,879 | B2 * | 8/2008 | Asao ............ G11C 11/16 365/158 |

(Continued)

FOREIGN PATENT DOCUMENTS

| JP | 2005-101535 | 4/2005 |
| JP | 2006-313999 | 11/2006 |

(Continued)

OTHER PUBLICATIONS

International Search Report issued by the Japanese Patent Office in corresponding International Application No. PCT/JP2014/069432, mailed Oct. 28, 2014, 8 pages.

(Continued)

*Primary Examiner* — Alexander H Taningco
*Assistant Examiner* — Seokjin Kim
(74) *Attorney, Agent, or Firm* — Finnegan, Henderson, Farabow, Garrett & Dunner, LLP

(57) ABSTRACT

According to one embodiment, a reconfigurable logic circuit device includes a memory circuit including a cell group which includes unit cells connected in series, a control circuit connected to the unit cell at one end of the cell group, and an output terminal connected to the unit cell at the other end of the cell group; and a switch circuit connected to the output terminal and controlled by a signal from the memory circuit. Each of the unit cells includes a select element including first and second terminals and a control terminal to which a control signal is input, and a memory element including a third terminal connected to the first terminal and a fourth terminal connected to the second terminal.

7 Claims, 15 Drawing Sheets

(58) Field of Classification Search
USPC .......................................................... 326/113
See application file for complete search history.

(56) References Cited

U.S. PATENT DOCUMENTS

| | | | | |
|---|---|---|---|---|
| 7,583,528 | B2* | 9/2009 | Aoki | G11C 11/15 |
| | | | | 365/158 |
| 7,804,730 | B2 | 9/2010 | Redgrave et al. | |
| 7,830,693 | B2* | 11/2010 | Liu | G11C 11/16 |
| | | | | 365/148 |
| 8,115,188 | B2* | 2/2012 | Gosain | G02F 1/1362 |
| | | | | 257/4 |
| 9,025,369 | B2* | 5/2015 | Takashima | H01L 27/2436 |
| | | | | 365/148 |
| 2005/0045919 | A1* | 3/2005 | Kaeriyama | G11C 11/5614 |
| | | | | 257/211 |
| 2007/0091673 | A1* | 4/2007 | Asao | G11C 11/16 |
| | | | | 365/171 |
| 2010/0246240 | A1* | 9/2010 | Nakaya | B82Y 10/00 |
| | | | | 365/148 |
| 2013/0076392 | A1 | 3/2013 | Zaitsu et al. | |

FOREIGN PATENT DOCUMENTS

| | | |
|---|---|---|
| JP | 2007-115956 | 5/2007 |
| JP | 2008/042114 | 2/2008 |
| JP | 2010-182787 | 8/2010 |
| JP | 2013-70256 | 4/2013 |
| WO | WO 2009/066500 A1 | 5/2009 |

OTHER PUBLICATIONS

Notification of Transmittal, International Preliminary Report on Patentability, and Written Opinion mailed on Feb. 4, 2016, in counterpart International Application No. PCT/JP2014/069432.

* cited by examiner

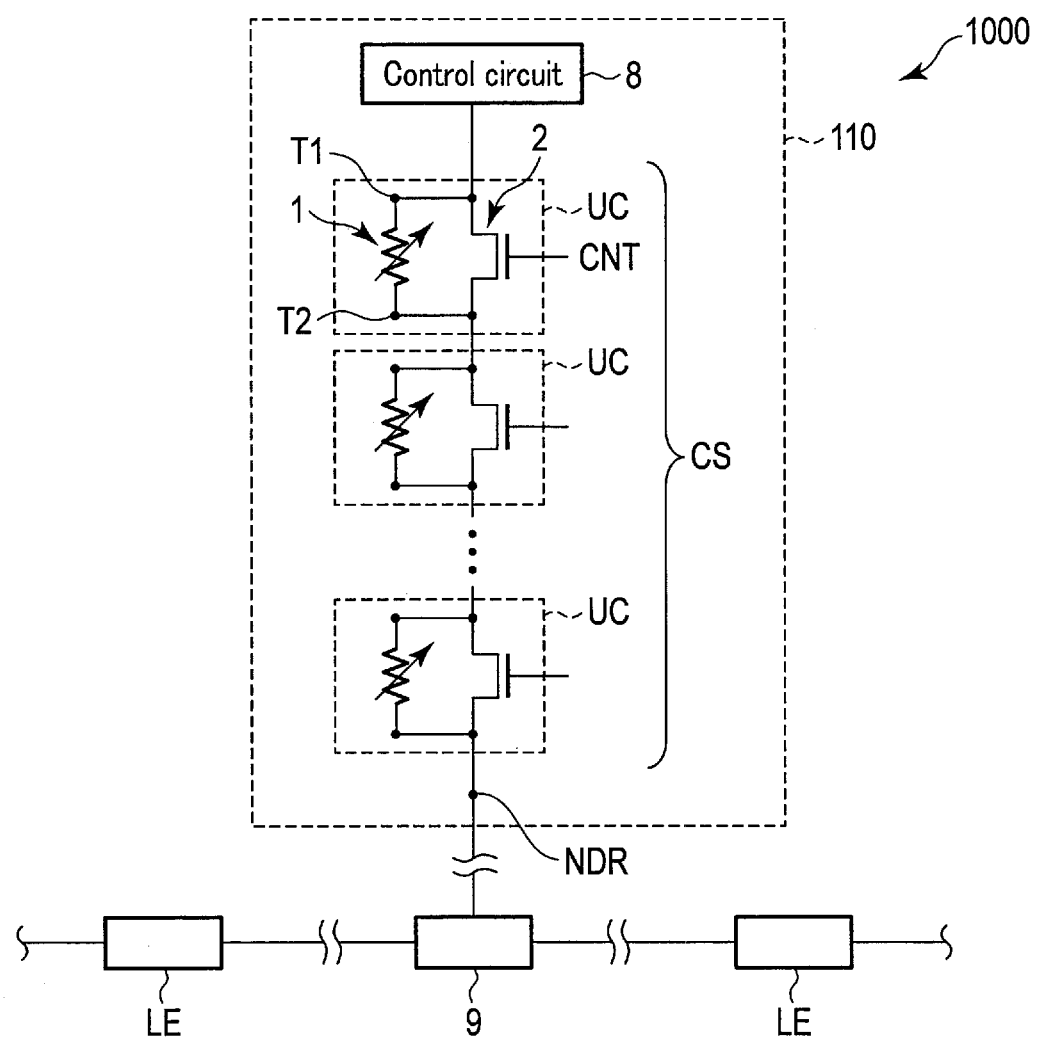
F I G. 1

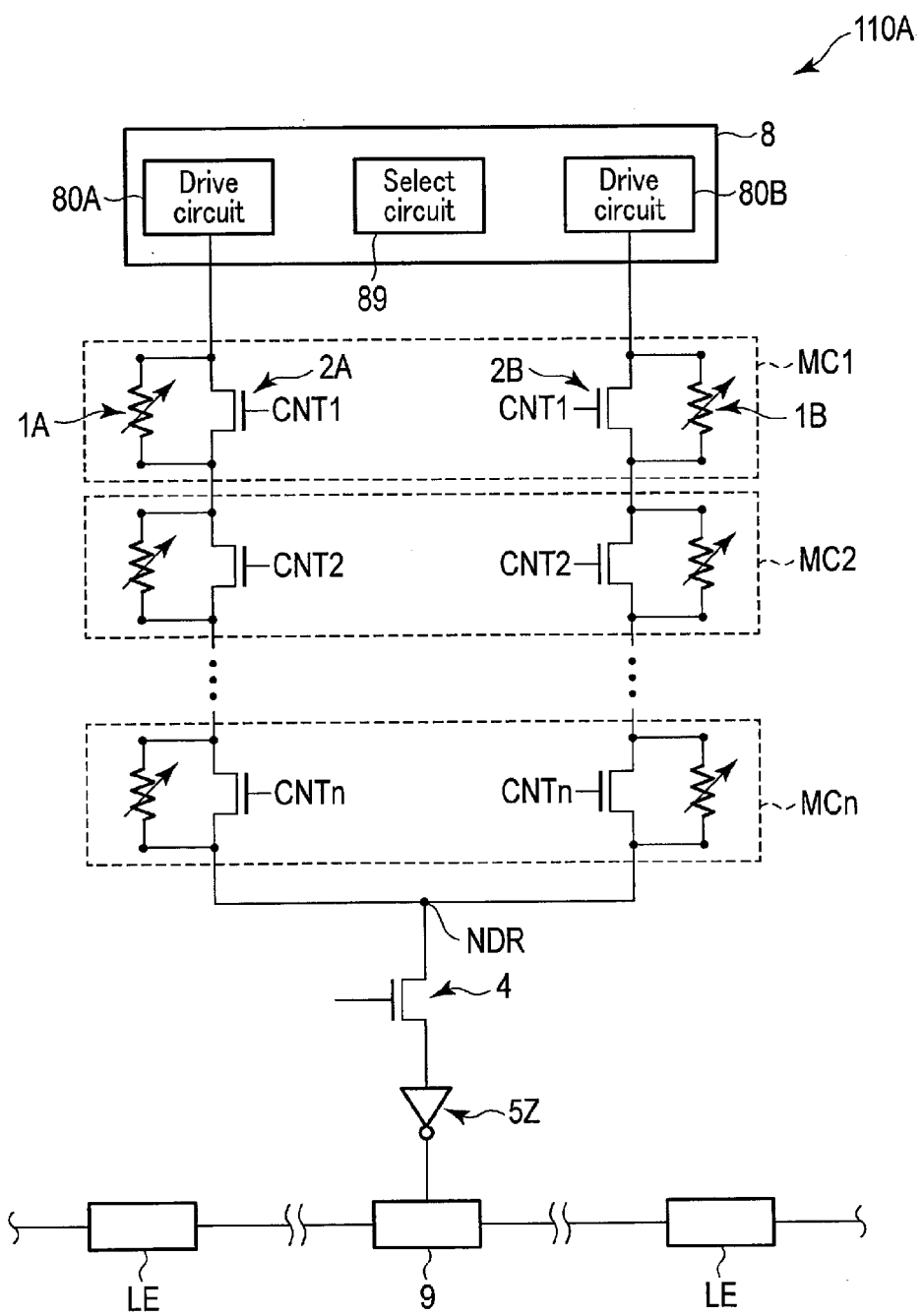
F I G. 7

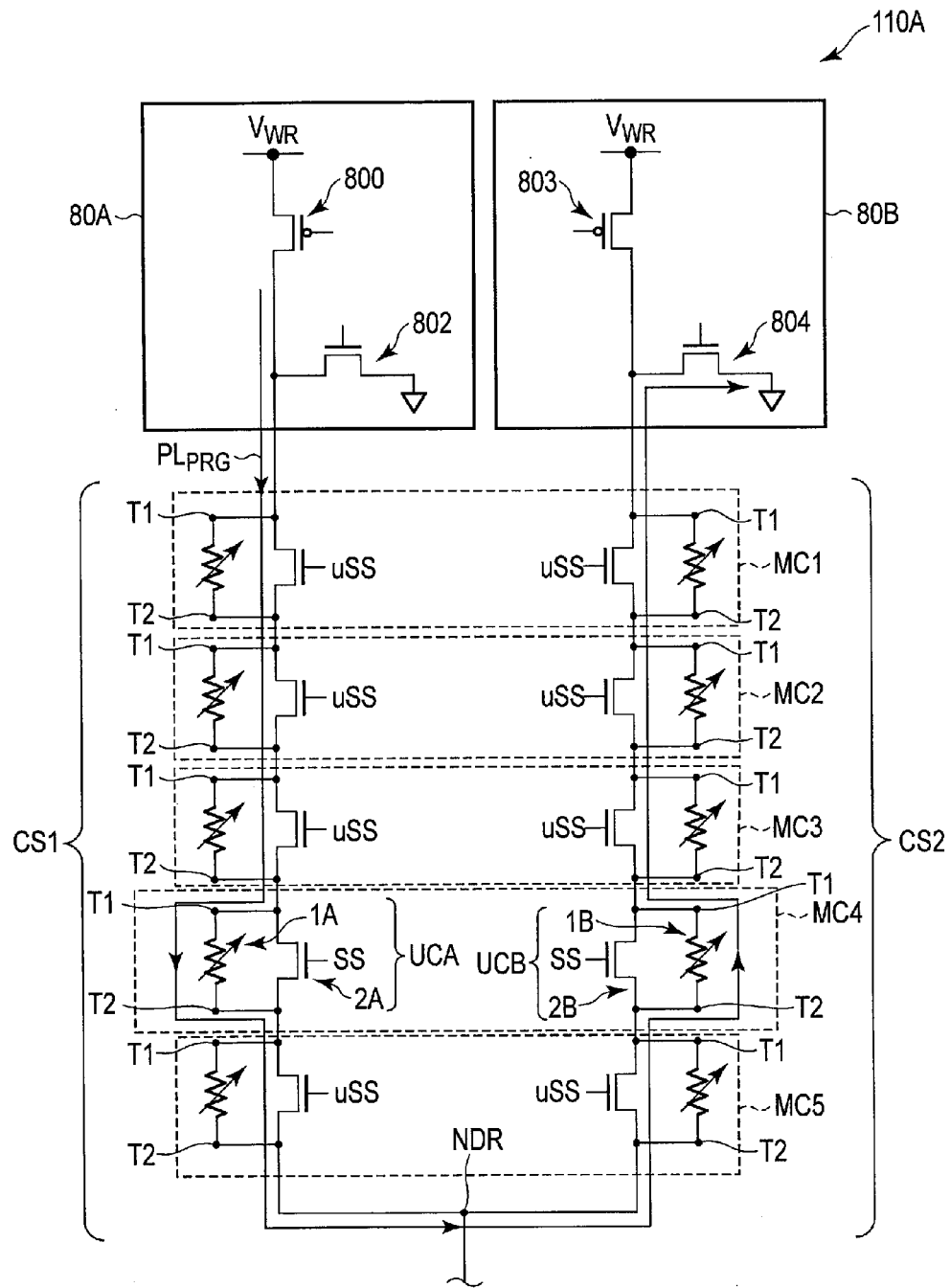
F I G. 8

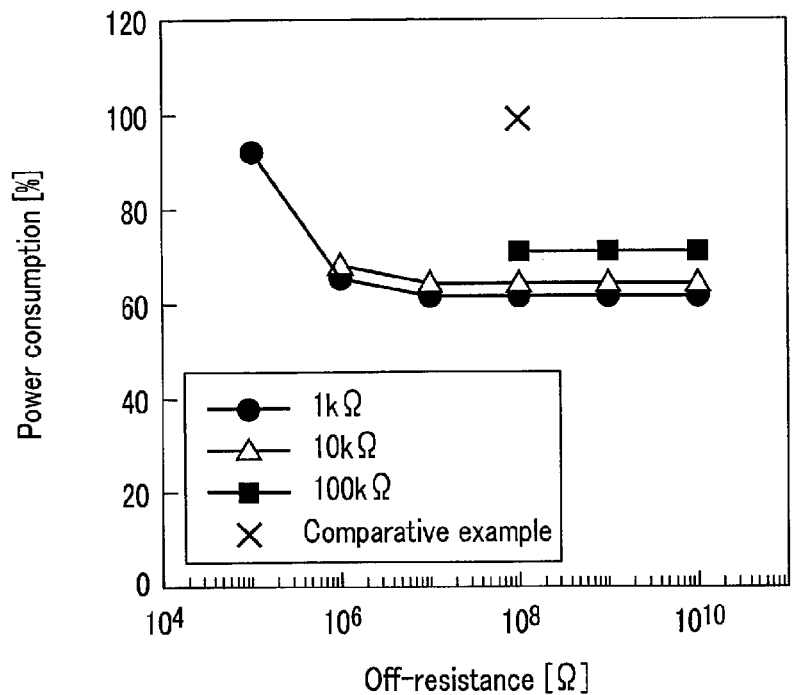
F I G. 11
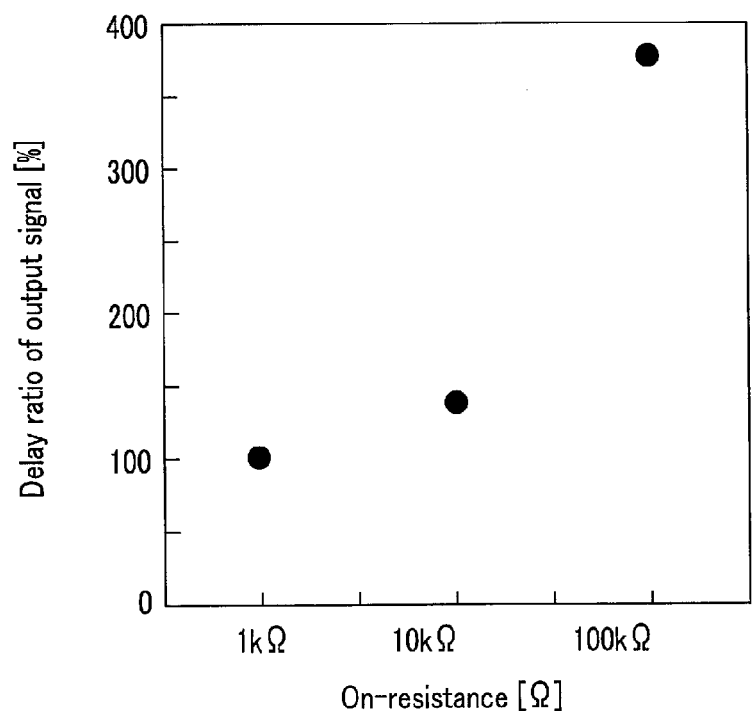
F I G. 12

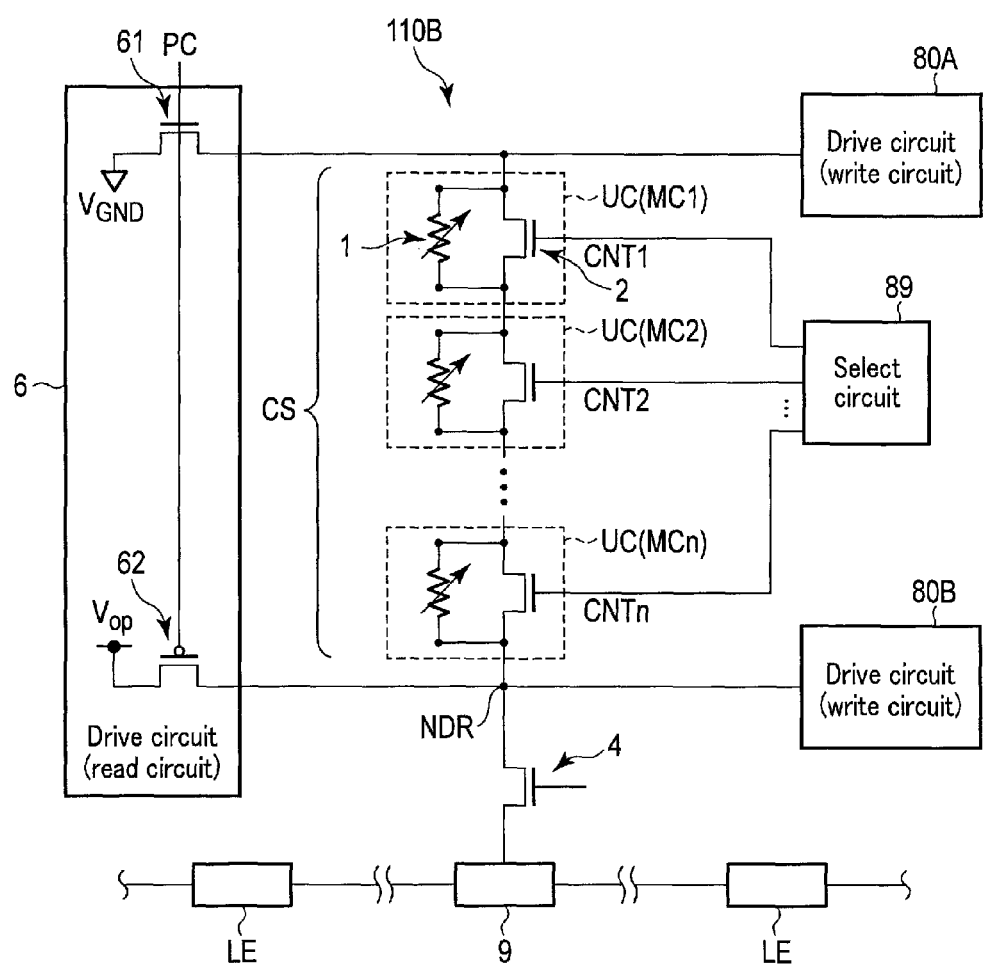
F I G. 13

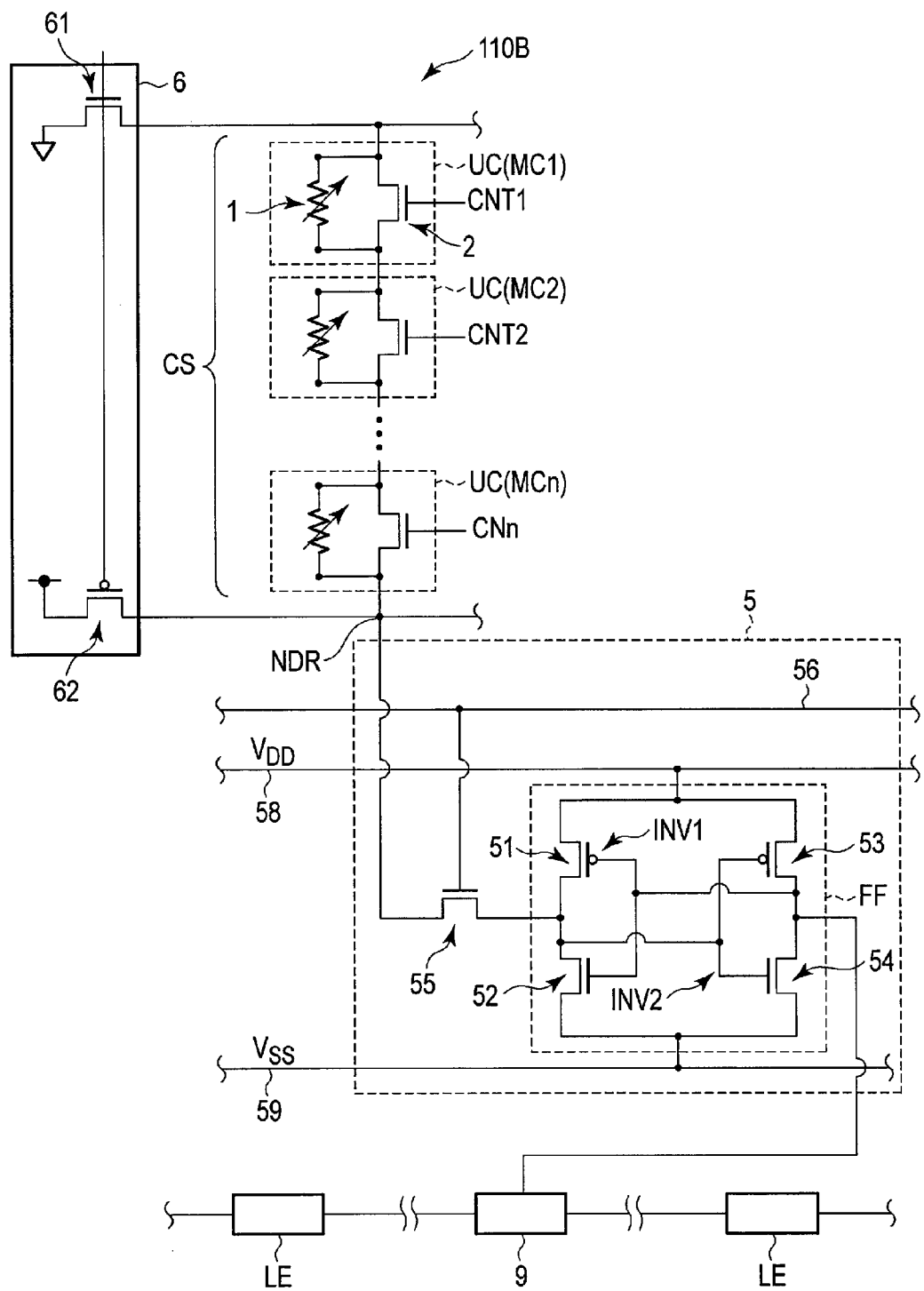
F I G. 14

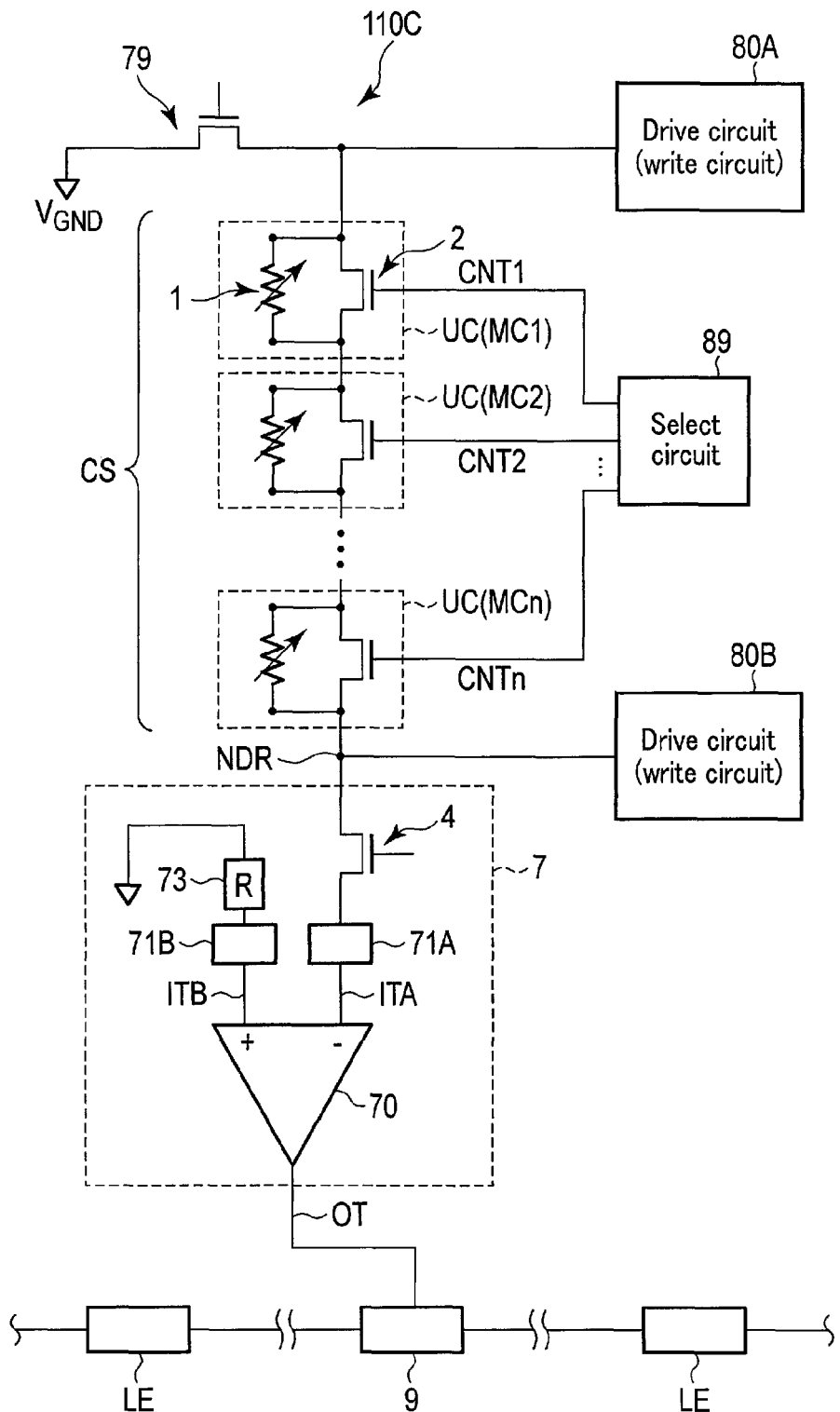
F I G. 15

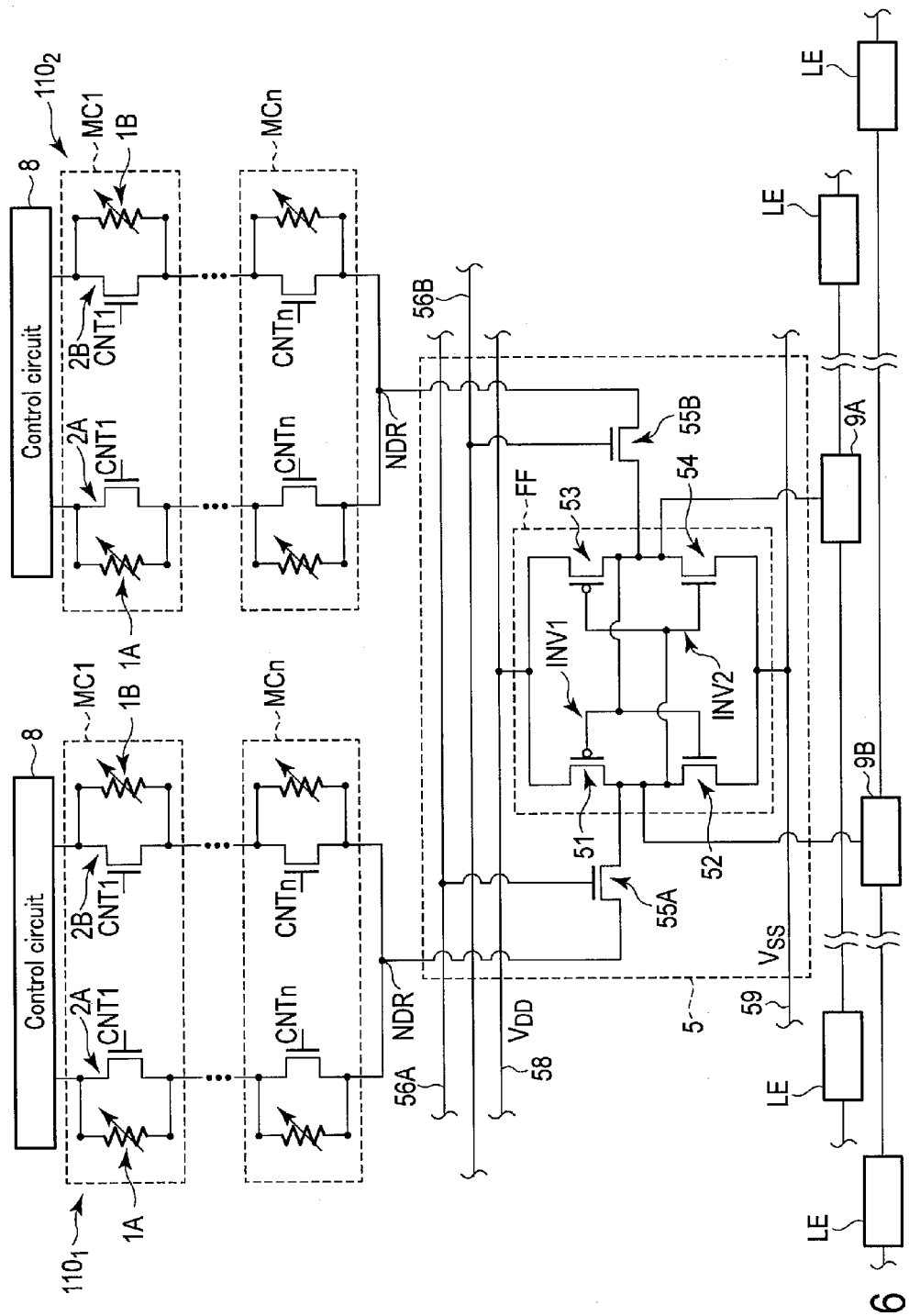
F I G. 16

RECONFIGURABLE LOGIC CIRCUIT DEVICE

CROSS-REFERENCE TO RELATED APPLICATIONS

This application is a Continuation application of PCT Application No. PCT/JP2014/069432, filed Jul. 23, 2014 and based upon and claiming the benefit of priority from Japanese Patent Application No. 2013-153698, filed Jul. 24, 2013, the entire contents of all of which are incorporated herein by reference.

FIELD

The present Embodiment relates to a reconfigurable logic circuit device.

BACKGROUND

A reconfigurable logic circuit such as a field programmable gate array (FPGA) can be rewritten to a desired circuit by a user after the manufacture/shipment of a chip, and can therefore reduce the development time of an LSI chip.

The FPGA is, for example, a circuit composed of logic elements (logic gates) based on a look-up table and a switch for switching the connection of the logic elements.

The FPGA includes a configuration memory to control the connection between the logic elements and the switch. Rewriting information stored in the configuration memory allows the FPGA to be used to construct any circuit.

The general FPGA in the mainstream is an FPGA that uses a volatile SRAM as a configuration memory. The FPGA that uses the SRAM has some problems, such as high power consumption, and a configuration memory that uses a nonvolatile memory has been developed and considered.

BRIEF DESCRIPTION OF THE DRAWINGS

FIG. 1 is a diagram illustrating the basic configuration of a reconfigurable logic circuit according to an embodiment;

FIGS. 6 and 7 are equivalent circuit diagrams showing modifications of the reconfigurable logic circuit according to the first embodiment;

FIGS. 8, 9 and 10 are diagrams illustrating operation examples of the reconfigurable logic circuit according to the first embodiment;

FIGS. 11 and 12 are graphs illustrating characteristics of the reconfigurable logic circuit according to the embodiment;

FIG. 13 is an equivalent circuit diagram showing a configuration example of a reconfigurable logic circuit according to a second embodiment;

FIG. 14 is an equivalent circuit diagram showing a modification of the reconfigurable logic circuit according to the second embodiment;

FIG. 15 is an equivalent circuit diagram showing a configuration example of a reconfigurable logic circuit according to a third embodiment; and FIG. 16 is an equivalent circuit diagram showing a modification of the reconfigurable logic circuit according to the embodiment.

DETAILED DESCRIPTION

Hereinafter, embodiments will be described in detail with reference to the drawings. Elements having the same functions and configurations are denoted with the same reference signs in the following explanation, and are repeatedly explained when necessary.

In general, according to one embodiment, a reconfigurable logic circuit device includes a memory circuit including a first cell group which includes first unit cells connected in series, a control circuit connected to the first unit cell at one end of the first cell group, and an output terminal connected to the first unit cell at the other end of the first cell group; and a switch circuit which is connected to the output terminal and which is controlled by an output signal from the memory circuit. Each of the first unit cells includes a select element and a memory element. The select element includes first and second terminals and a control terminal to which a control signal is input. The memory element includes a third terminal connected to the first terminal and a fourth terminal connected to the second terminal. Resistance states of the memory element are associated with data to be stored.

EMBODIMENTS

A reconfigurable logic circuit device according to the embodiment is described with reference to FIG. 1 to FIG. 16.

(1) Basic Configuration

The basic configuration of the reconfigurable logic circuit device (the reconfigurable logic circuit) according to the embodiment is described with reference to FIG. 1 and FIG. 2.

FIG. 1 is an equivalent circuit diagram showing the basic configuration of the reconfigurable logic circuit according to the embodiment.

The reconfigurable logic circuit according to the embodiment is a semiconductor integrated circuit (logic circuit) that can be reconfigured a logic structure for signal processing on the basis of information stored in a memory circuit.

As shown in FIG. 1, a reconfigurable logic circuit 1000 according to the embodiment includes a memory circuit 110, and the memory circuit 110 includes unit cells (cell group) UC. One or more unit cells UC are used to form memory cells to store data.

Each of the unit cells UC includes one memory element 1 and one select element 2.

The memory element (nonvolatile memory element) 1 can store written data substantially in a nonvolatile manner. The memory element 1 is a resistance change element 1, and can take more than one resistance state (e.g., a low-resistance state and a high-resistance state).

The memory circuit 110 that uses the resistance change element 1 as the memory element 1 stores data by associating the data to be stored with the resistance state of the resistance change element 1.

Figure 2:
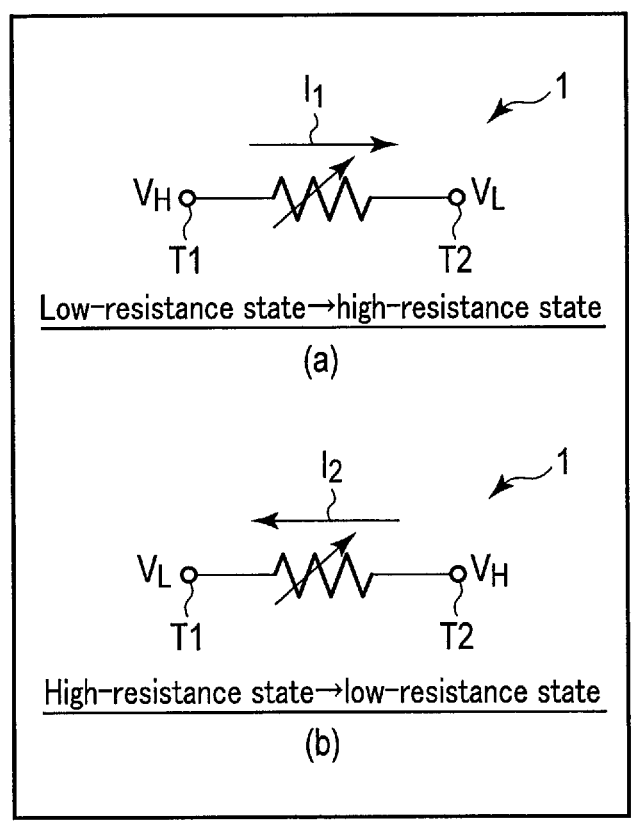
FIG. 2 is a diagram illustrating a memory element of a memory circuit of the reconfigurable logic circuit.

FIG. 2 is a diagram illustrating the configuration of the memory element used in the unit cell UC of the memory circuit in the reconfigurable logic circuit according to the embodiment.

As shown in FIG. 2, the memory element 1 used in the unit cell UC is the resistance change element 1 having a first terminal T1 and a second terminal T2.

One element selected from the group consisting of a magnetic tunnel junction (MTJ) element, an oxidation-reduction resistance change element, an ion-conducting resistance change element, and a phase change element and the like is used for the resistance change element 1 as the memory element 1. The MTJ element has a structure in which a tunnel barrier layer (e.g., an insulating layer) intervenes between two magnetic layers. The MTJ element changes the resistance state (resistance value) in accordance with the relative magnetization arrangement of the two magnetic layers. The oxidation-reduction resistance change element has a structure in which a transition metal oxide layer intervenes between two electrodes (e.g., metallic layers). The element changes the resistance state in accordance with the movement (or occurrence or disappearance) of oxygen deficiency of the transition metal oxide layer. The ion-conducting resistance change element has a structure in which, for example, a semiconductor layer intervenes between two electrodes. The element changes the resistance state in accordance with the migration of ions of, for example, a metal in the semiconductor layer. The phase change element has a phase change layer made of a phase change material (e.g., a chalcogenide material). The element changes the resistance state in accordance with the change of the phase (crystalline state/amorphous state) of the phase change layer caused by Joule heat resulting from a current.

The resistance change element 1 as the memory element 1 changes the resistance state in accordance with a potential difference equal to or more than a threshold value applied to one end T1 and the other end T2 of the resistance change element 1 or in accordance with a current equal to or more than a threshold value resulting from a potential difference. Depending on the kind (material) of the resistance change element 1, the resistance state of the resistance change element 1 as the memory element 1 changes in accordance with the polarity (supply direction) of a voltage/current, or changes in accordance with the pulse shape (amplitude and pulse width) of a voltage pulse/current pulse. The resistance state of the resistance change element 1 can be kept substantially nonvolatile until a voltage/current to change the resistance state of the resistance change element 1 is supplied.

FIG. 2 (a) and (b) show the relation of voltages across the terminals T1 and T2 of the resistance change element 1 when the resistance state of the resistance change element 1 changes in accordance with the polarity of a voltage/current.

When the resistance state of the resistance change element 1 depends on the polarity of a voltage/current, voltages $V_H$ and $V_L$ of the terminals T1 and T2 of the resistance change element 1 are set so that a potential difference equal to or more than a threshold voltage Vth at which the resistance state of the resistance change element 1 changes (or a current equal to or more than a threshold current Ith) will be supplied to the resistance change element 1.

For example, when the resistance state of the resistance change element 1 changes in accordance with the polarity of a voltage/current, the high voltage $V_H$ (e.g., a threshold voltage Vth) is applied to the terminal T1 of the resistance change element 1 in the low-resistance state ("low (L)" state), and the low voltage $V_L$ (e.g., 0 V) is applied to the terminal T2 of the resistance change element 1 in the low-resistance state, as shown in (a) of FIG. 2. A current I1 flows through the resistance change element 1 in a direction from the terminal T1 of the resistance change element 1 to the terminal T2 in accordance with a potential difference $V_H$–$V_L$ (=Vth) of the resistance change element 1. When the change of the resistance state of the resistance change element 1 depends on the current I1, the intensities of the voltages $V_H$ and $V_L$ to be applied to the terminals T1 and T2 are suitably set so that the current $I_1$ equal to or more than the threshold current Ith to change the resistance state of the resistance change element 1 will be generated.

Thus, when the resistance state of the resistance change element 1 is to be changed, the terminal T1 of the resistance change element 1 is set to a high potential side and the terminal T2 of the resistance change element 1 is set to a low potential side, so that the resistance state of the resistance change element 1 changes from the low-resistance state to the high-resistance state ("high (H)" state).

As shown in (b) of FIG. 2, in contrast with (a) of FIG. 2, the low voltage $V_L$ is applied to the terminal T1 of the resistance change element 1 in the high-resistance state, and the high voltage $V_H$ is applied to the terminal T2 of the resistance change element 1 in the high-resistance state. Accordingly, a current $I_2$ resulting from a potential difference between the terminals T1 and T2 flows in a direction from the terminal T2 of the resistance change element 1 to the terminal T1. At the same time, the resistance state of the resistance change element 1 changes from the high-resistance state to the low-resistance state in accordance with a voltage or current equal to or more than a threshold value resulting from the voltages $V_H$ and $V_L$.

When the resistance state of the resistance change element 1 changes in accordance with the polarity of a voltage/current as shown in FIG. 2, the resistance state of the resistance change element 1 changes in accordance with the positive or negative direction of the potential difference equal to or more than the threshold value applied across the terminals T1 and T2 of the resistance change element 1 and the flowing directions of the currents $I_1$ and $I_2$ equal to or more than the threshold value in the resistance change element 1. In this case, the resistance change element 1 has polarities. Hereinafter, of the two terminals T1 and T2 of the resistance change element 1 having polarities regarding the change of the resistance state, one terminal T1 is referred to as a first polarity terminal T1, and the other terminal T2 is referred to as a second polarity terminal T2.

The variable resistance state of the resistance change element 1 is associated with the data to be stored, and the resistance change element 1 is thereby used as the writable and erasable memory element. Hereinafter, the low-resistance state of the resistance change element 1 is a written state, and the high-resistance state of the resistance change element 1 is an erased state. Contrarily, when the high-resistance state of the resistance change element 1 is the written state and the low-resistance state of the resistance change element 1 is the erased state, the configurations of the unit cells UC and the memory circuit 110 that uses the unit cells UC are unchanged.

When the operation to bring the resistance change element into the written state is not distinguished from the operation to bring the resistance change element into the erased state, these operations are hereinafter briefly referred to as data writing or a writing operation (or a program operation). The operation to change the resistance state of the resistance change element 1 from the high-resistance state to the low-resistance state may be referred to as a set operation, and the operation to change the resistance state of the resistance change element 1 from the low-resistance state to the high-resistance state may be referred to as a reset operation.

This resistance change element 1 as the memory element 1 may be provided in an interconnect layer (interlayer insulating film), or may be provided on or in a semiconductor substrate (e.g., a silicon substrate).

The select element 2 of the unit cell UC is, for example, a field effect transistor (e.g., an n-channel type MOS transistor) 2. Hereinafter, the field effect transistor as the select element 2 of the unit cell UC is referred to as a select transistor (or a cell transistor) 2.

In each of the unit cells UC, the terminal T1 of the resistance change element 1 as the memory element is connected to one end (the terminal of the select element) of the current path of the select transistor 2, and the terminal T2 of the resistance change element 1 is connected to the other end (the terminal of the select element) of the current path of the select transistor 2. The resistance change element 1 is connected in parallel to the current path (channel region) of the select transistor 2.

The gate of the select transistor 2 is connected to a select signal line (not shown), and a control signal CNT is supplied to the gate of the select transistor 2.

When the select transistor 2 is an n-channel type MOS transistor (hereinafter referred to as an n-type transistor), the memory element 1 of the unit cell UC is brought to a selected state (activated state) by the control signal CNT at an "L" level, and the memory element 1 of the unit cell UC is brought to an unselected state (deactivated state) by the control signal CNT at an "H" level.

In the memory circuit 110 of the reconfigurable logic circuit 1000 according to the embodiment, the current paths of the unit cells UC are connected in series. More specifically, in the unit cells UC included in the memory circuit 110 of the reconfigurable logic circuit 1000 according to the present embodiment, the current paths of the select transistors 2 are connected in series.

Hereinafter, a circuit configuration CS composed of the unit cells UC connected in series is referred to as a cell string CS.

For example, one end of the cell string CS in the memory circuit 110 (the unit cell on one end side of the cell string CS) is connected to a control circuit (drive circuit) 8 including a power supply used in the operation of the memory circuit and others, and the other end NDR of the cell string CS (the unit cell on the other end side of the cell string CS) is connected to a switch circuit 9. This switch circuit 9 is a switch element such as a transistor or an inverter that is driven by the control of the voltage of a control terminal (gate) of the element. Logic elements (logic gates or logic circuits) LE are connected to the current path of the switch circuit 9.

The operation of the switch circuit 9 is controlled by an output signal (data) of the memory circuit 110 in accordance with the data retention state of the unit cells UC used in the memory circuit (the resistance state of the resistance change element 1). For example, the switch circuit 9 is turned on or off so that the logic elements LE are electrically connected to or electrically disconnected from each other.

The switch circuit 9 may be treated as an internal circuit of the memory circuit 110.

For example, in the present embodiment, the memory circuit 110 including the cell string CS as shown in FIG. 1 is used as a configuration memory to store configuration information. A logic circuit in an FPGA as the reconfigurable logic circuit 1000 is formed by the configuration information in the memory circuit 110.

As shown in FIG. 1, the unit cells UC constituting the memory circuit 110 of the reconfigurable logic circuit 1000 according to the embodiment are connected in series, so that the leak current of the memory circuit 110 can be reduced.

Consequently, the reconfigurable logic circuit according to the embodiment can reduce power consumption.

(2) First Embodiment

A semiconductor integrated circuit according to the first embodiment is described with reference to FIG. 3 to FIG. 12.

(a) Circuit

A circuit configuration of the semiconductor integrated circuit (reconfigurable logic circuit) according to the first embodiment is described with reference to FIG. 3 to FIG. 7.

Figure 3:
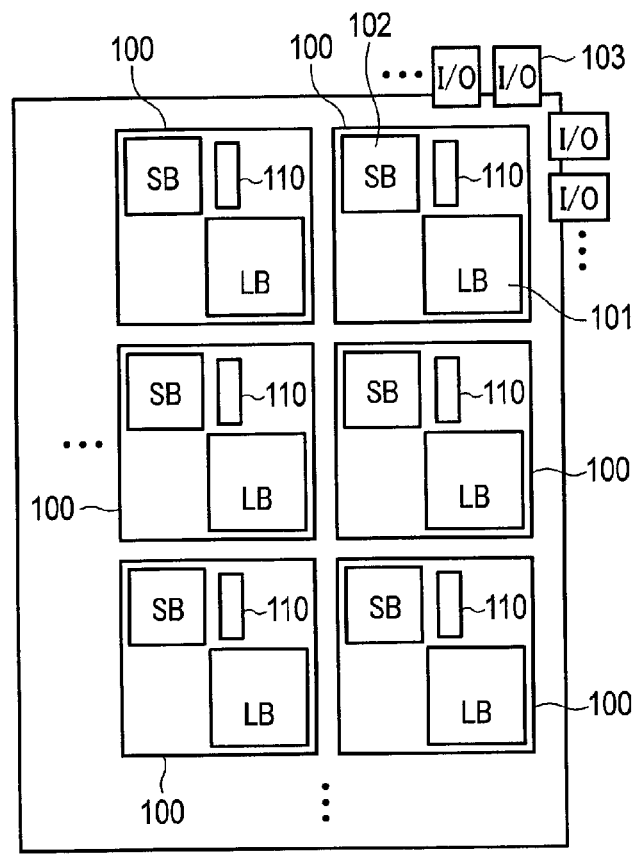
FIGS. 3, 4A, 4B and 4C are diagrams illustrating reconfigurable logic circuits according to the first embodiment.
Figure 4A:
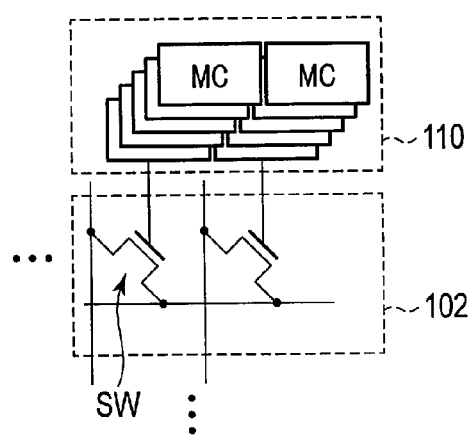
Figure 4B:
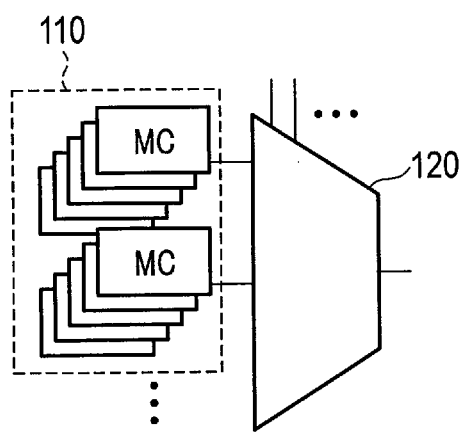
Figure 4C:
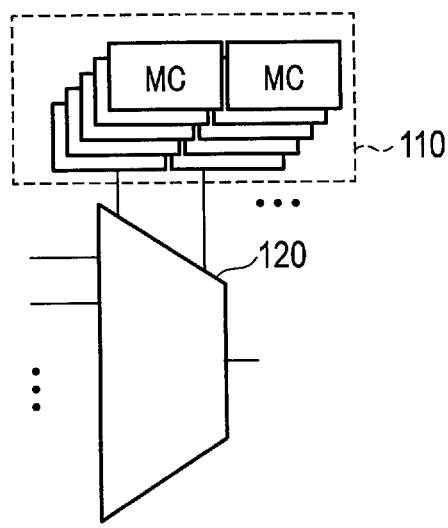

FIG. 3 to FIG. 4C are diagrams illustrating the reconfigurable logic circuit (reconstructable circuit) according to the first embodiment.

The reconfigurable logic circuit 1000 according to the embodiment shown in FIG. 3 is, for example, an FPGA 1000 including the memory circuit 110 (110A). The FPGA 1000 includes a logic block (LB) 101, a switch block (SB) 102, and an input/output circuit (I/O circuit) 103.

The logic block 101 is, for example, a look-up table type, multiplexer type, or transistor array type circuit region including the logic elements (logic gates) to enable basic logic information (logic circuits). The switch block 102 is a circuit region including a switch to connect the logic blocks 101. A basic tile 100 of the FPGA 1000 is formed by one logic block 101 and one switch block 102. Multiple basic tiles 100 are provided in the FPGA 1000.

The I/O circuit 103 outputs signals from the logic block 101 to the outside of the FPGA 1000, and inputs signals from the outside of the FPGA 1000 to the logic block 101. The I/O circuit 103 is provided around a region (tile array) in which multiple basic tiles 100 are arrayed.

On the basis of the configuration information provided from the user, a circuit which performs a predetermined logic operation required by the user is constructed by the logic block 101 and the switch block 102.

In the present embodiment, the FPGA 1000 as the reconfigurable logic circuit includes the memory circuit 110 (110A), and the memory circuit 110A stores the configuration information regarding the FPGA 1000.

For example, as shown in FIG. 3, the memory circuit 110 is provided in each basic tile 100. The memory circuit 110 may be provided in the logic block 101, or may be provided in the switch block 102. One memory circuit 110 may be provided in the FPGA 1000 to correspond to multiple basic tiles 100.

For example, the memory circuit 110 is used as the configuration memory (hereinafter referred to as a multi-context memory) of the FPGA 1000 that uses multi-context technology.

FIG. 4A, FIG. 4B, and FIG. 4C are schematic diagrams showing a configuration example in which the memory circuit 110 (110A) to store configuration information regarding the FPGA 1000 according to the present embodiment is used as a multi-context memory.

As shown in FIG. 4A, FIG. 4B, and FIG. 4C, the memory circuit 110 (110A) includes memory cells MC. For example, the memory cell MC stores one-bit data.

As shown in FIG. 4A, the memory cells MC of the memory circuit 110 (110A) are connected to the gate of a field effect transistor SW as a switch element SW in the switch block 102. The connection of the memory cells MC and the field effect transistor SW is switched so that one switch block 102 is used more than one time.

As shown in FIG. 4B and FIG. 4C, the memory circuit 110 (110A) is connected to a multiplexer 120.

In the example shown in FIG. 4B, the memory cells MC of the memory circuit 110 are connected to each of the input terminals of the multiplexer 120. The connection of the memory cells MC and the input terminal of the multiplexer 120 is switched so that information in each memory cell MC is sequentially supplied as an input signal to the multiplexer 120 by the switching timing of the connection to the input terminal of the multiplexer 120.

As in the example shown in FIG. 4C, the memory cells MC are connected to each of the control terminals of the multiplexer 120. In this case, the information in each memory cell MC is supplied to a certain control terminal as a control signal of the multiplexer 120.

The connection of the memory cells MC and the control terminal of the multiplexer 120 is switched so that the connection of the input terminal and output terminal of the multiplexer 120 is sequentially switched.

Thus, the multi-context technology to perform a logic operation required by the user by switching the connection between one component in the FPGA 1000 and the memory cells in the memory circuit is applied to the FPGA 1000 including the memory circuit according to the present embodiment, so that the area (chip size) of the FPGA 1000 is reduced.

Figure 5:
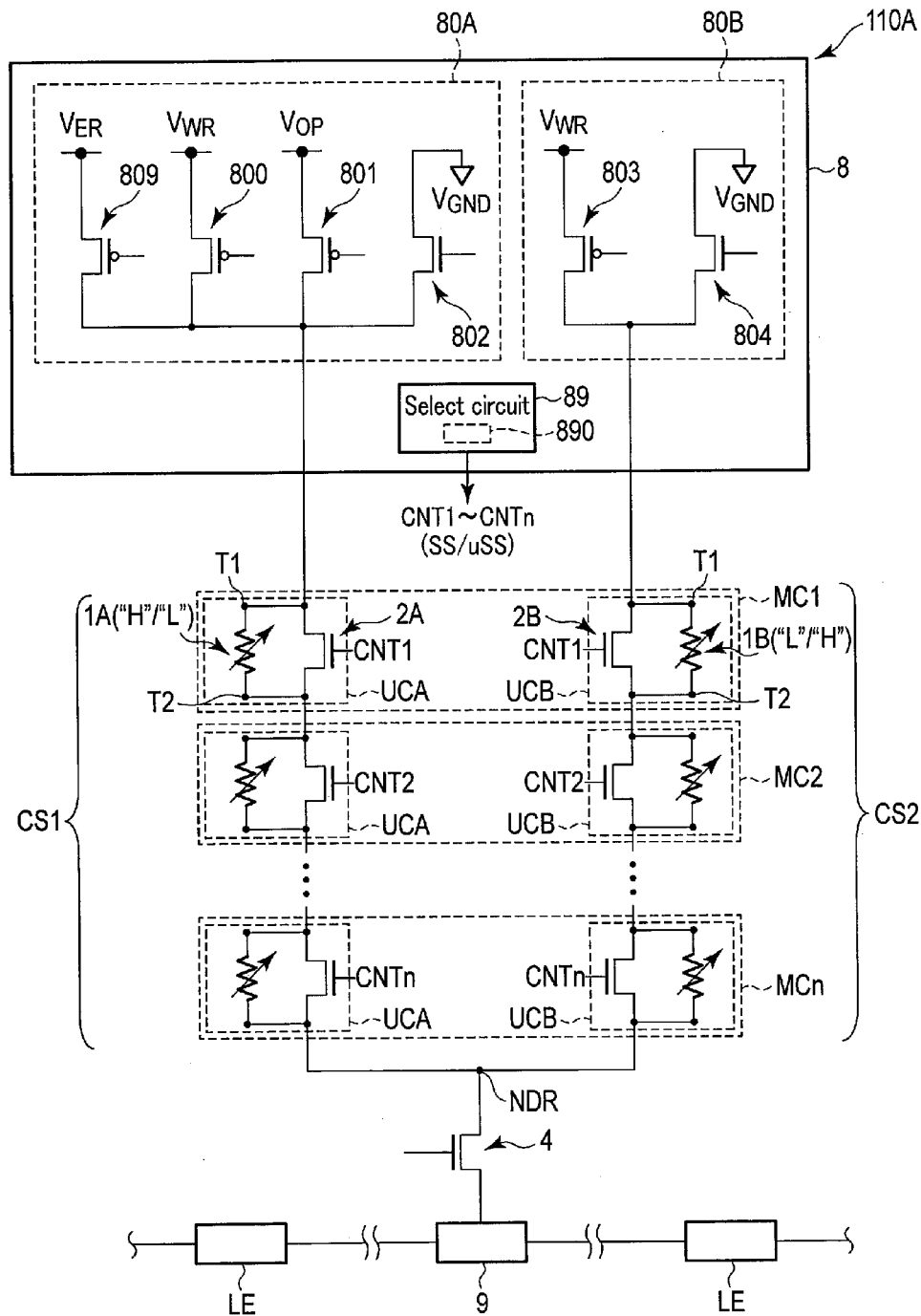
FIG. 5 is an equivalent circuit diagram showing a configuration example of the reconfigurable logic circuit according to the first embodiment.

FIG. 5 is an equivalent circuit diagram showing an example of the circuit configuration of the memory circuit included in the FPGA according to the first embodiment.

As shown in FIG. 5, the memory circuit 110A included in the FPGA according to the present embodiment includes unit cells UCA and UCB, and the current paths of the unit cells UCA and UCB are connected in series.

The control circuit 8 is connected to cell strings CS1 and CS2 which comprise the unit cells UCA and UCB having their current paths connected in series. The control circuit 8 controls the operations of the unit cells UCA and UCB.

In the memory circuit 110A shown in FIG. 5, an output terminal (read node) NDR for outputting signals from the unit cells UCA and UCB is provided at the midpoint between one end and the other end of the unit cells UCA and UCB having their current paths connected in series. The switch circuit 9 may be connected to the output terminal NDR, for example, via a field effect transistor (n-channel type transistor) 4.

In the memory circuit 110A of the FPGA according to the present embodiment, one memory cell (or also referred to as a programmable cell) MC1, MC2, . . . , MCn is formed by the use of two unit cells UCA and UCB. Each memory cell MC1, MC2, . . . , MCn includes two memory elements 1A and 1B and two select transistors 2A and 2B.

A control signal (select signal) CNT1, CNT2, . . . , CNTn is supplied to each memory cell MC1, MC2, . . . , MCn. The two unit cells UCA and UCB in each memory cell MC1, MC2, . . . , MCn are controlled by, for example, the control signal CNT1, CNT2, . . . , CNTn.

Hereinafter, for clarity of explanation, the memory cells MC1, MC2, . . . , MCn are mentioned as memory cells MC when not distinguished from one another. The control signal CNT1, CNT2, . . . , CNTn are mentioned as control signals CNT when not distinguished from one another.

Regarding the two unit cells UCA and UCB constituting each memory cell MC, the memory circuit 110A used in the FPGA according to the present embodiment includes a first cell string (first cell group) CS1 including first unit cells UCA, and a second cell string (second cell group) CS2 including second unit cells UCB.

Each memory cell MC is composed of one unit cell UCA belonging to the first cell string CS1 and one unit cell UCB belonging to the second cell string CS2. The number of the second unit cells UCB in the second cell string CS2 is the same as the number of the first unit cells UCA in the first cell string CS1. Hereinafter, the unit cells UCA and UCB are mentioned as unit cells UC when not distinguished from one another. The memory elements 1A and 1B in the two unit cells UCA and UCB constituting the memory cell are mentioned as memory elements 1 when not distinguished from one another. The select transistors 2A and 2B are mentioned as select transistors 2 when not distinguished from each other.

Hereinafter, a configuration (memory region) including two cell strings CS1 and CS2 to constitute the memory cells MC is mentioned as a memory block MB.

The memory circuit 110A includes the control circuit 8. The control circuit 8 drives and selects the memory cells MC and the unit cells UCA and UCB in the memory block MB.

The control circuit 8 includes drive circuits 80A and 80B and a select circuit 89.

The first drive circuit 80A is connected to one end of the first cell string CS1, and the second drive circuit 80B is connected to one end of the second cell string CSB. The first and second drive circuits 80A and 80B include a voltage source (or a current source) to drive the memory circuit 110A.

The first drive circuit 80A has a power supply terminal $V_{WR}$, a power supply terminal $V_{OP}$, and a ground terminal $V_{GND}$. A voltage (write voltage/erase voltage) $V_{WR}$ to write data into the memory cells MC (to change the resistance states of the resistance change elements 1A and 1B) is input to the power supply terminal $V_{WR}$. A voltage (read voltage, FPGA operating voltage) $V_{OP}$ to read data in the memory cells MC is input to the power supply terminal $V_{OP}$. A ground voltage $V_{GND}$ is input to the ground terminal $V_{GND}$. Predetermined voltages $V_{WR}$, $V_{OP}$, and $V_{GND}$ are supplied to the cell strings CS1 and CS2 from the respective terminals $V_{WR}$, $V_{OP}$, and $V_{GND}$.

The power supply terminals $V_{WR}$ and $V_{OP}$ of the first drive circuit 80A are connected to one end of the cell string CS1 via p-channel type MOS transistors (hereinafter referred to as p-type transistors) 800 and 801 as switch elements. The ground terminal $V_{GND}$ is connected to one end of the cell string CS1 via an n-type transistor 802. The transistors 800, 801, and 802 are switched on/off to control the connection between the power supply/ground terminals $V_{WR}$, $V_{OP}$, and $V_{GND}$ and the cell strings CS1 and CS2.

The second drive circuit 80B has a power supply terminal $V_{WR}$ which outputs a voltage $V_{WR}$ to write data into the memory cells MC, and a ground terminal $V_{GND}$.

The power supply terminal $V_{WR}$ of the second drive circuit 80B is connected to one end of the cell string CS2 via a p-type transistor 803 as a switch element. The ground terminal $V_{GND}$ of the second drive circuit 80B is connected to one end of the cell string CS2 via an n-type transistor 804. The transistors 803 and 804 are switched on/off to control the connection between the power supply/ground terminals $V_{WR}$ and $V_{OP}$ and the cell string CS2.

During data writing and data reading, one of the two drive circuits 80A and 80B functions as a high-potential-side (current-supply-side) circuit (source circuit), and the other functions as a low-potential-side (current-absorption-side) circuit (sink circuit).

The write voltage $V_{WR}$ has a voltage value equal to or more than the threshold value $V_{th}$ to change the resistance states of the resistance change elements 1A and 1B as the memory elements, or a voltage value for generating an current equal to or more than the threshold value $I_{th}$ to change the resistance states of the resistance change elements 1A and 1B as the memory elements.

On the other hand, the read voltage $V_{OP}$ has a voltage value lower than the threshold value $V_{th}$, or a voltage value for generating a current lower than the threshold value $I_{th}$ so that the resistance states of the resistance change elements 1A and 1B are not changed during data reading.

When the resistance change element which changes in resistance state in accordance with the polarity of a voltage/current supplied thereto is used as the memory element, the resistance state of the resistance change element 1 as the memory element 1 can be changed by changing the direction in which a program voltage/program current is supplied to the resistance change element 1. When such a resistance change element is used as the memory element, it is preferable that the power supply terminals $V_{WR}$ which output the voltages $V_{WR}$ having substantially the same voltage value and polarity (the same pulse shape) are provided in both the drive circuits 80A and 80B at one end side and the other end side of the cell strings CS1 and CS2, as shown in FIG. 5.

Two or more power supply terminals different in output voltage value ($\geq V_{th}$) may be provided in the drive circuits 80A and 80B to program (write and erase) data in accordance with the mechanism (e.g., the intensity of the voltage value/current value, pulse width) of the change of the resistance states of the resistance change elements 1A and 1B. For example, when a unipolar type resistance change element is used as the memory element 1, at least one of the two drive circuits 80A and 80B may further include a power supply terminal $V_{ER}$ for outputting a voltage (erase voltage) $V_{ER}$ different in intensity from the voltage $V_{WR}$ to bring the resistance state of the resistance change element 1 to the erased state, and a switch element (p-type transistor) 809 which controls the connection between the power supply terminal $V_{ER}$ and the unit cell UC. The pulse width of the voltage pulse/current pulse supplied to the resistance change elements 1A and 1B during data writing/erasing can be controlled by the period in which the transistors 800 and 803 for voltage supply control are on. The power supply terminals $V_{ER}$ which output the erase voltage $V_{ER}$ and the switch elements may be provided in both of the two drive circuits 80A and 80B.

The write power supply and the erase power supply in the drive circuits 80A and 80B can be suitably added to and eliminated from the drive circuits 80A and 80B in accordance with the kind and characteristics of the resistance change element used as the memory element.

Hereinafter, the power supply terminal for outputting the voltage $V_{WR}$ and $V_{ER}$ to write data into the memory cells is referred to as a write power supply or a program power supply. The power supply terminal for outputting the voltage to read data is referred to as a read power supply. For clarity of explanation, the power supply terminal for outputting the voltage to bring the resistance state of the resistance change element to the erased state (high-resistance state) may be referred to as an erase power supply. In the present embodiment, in the drive circuits 80A and 80B, the circuit comprising an element used to write data such as the write power supply $V_{WR}$ may be referred to as a write circuit, and the circuit comprising an element used to read data such as the read power supply $V_{OP}$ may be referred to as a read circuit.

A select circuit 89 supplies the control signal CNT for controlling whether or not to select the memory cells MC to the select transistors 2A and 2B in the unit cells UCA and UCB in the memory cell MC. For example, the select circuit 89 outputs, as the control signals CNT, an "L" level select signal SS to bring the memory cell MC (unit cell UC) to the selected state, and an "H" level unselect signal uSS to bring the memory cell MC (unit cell UC) to the unselected state.

For example, when the memory circuit 110A in the FPGA is in operation, the control signals CNT at the same signal level are supplied to the gate of the select transistor 2A of the first unit cell UCA in the memory cell MC and to the gate of the select transistor 2B of the second unit cell UCB.

The gates of the two select transistors 2A and 2B of the memory cell MC may be connected to a common interconnect (not shown), and the control signal CNT at the predetermined signal level may be supplied to the gates of the two select transistors 2A and 2B from the common interconnect. Alternatively, the gates of the two select transistors 2A and 2B of the memory cell MC may be respectively connected to two separate interconnects (not shown), and the control signals CNT at the predetermined signal levels may be respectively supplied to the select transistors 2A and 2B from the interconnects. When the control signals CNT are supplied to the select transistors 2A and 2B from the two separate interconnects, the control signals CNT can be independently supplied to the two select transistors 2A and 2B in the same memory cell, and the operation of each of the unit cells UCA and UCB can be separately controlled.

The select circuit 89 has one or more select signal generating circuits 890 for selecting a predetermined memory cell MC on the basis of an external control signal (e.g., a clock signal or an address signal). When the two unit cells UCA and UCB in the memory cell MC are controlled by a common control signal CNT, one select signal generating circuit 890 is provided. When the two unit cells UCA and UCB in the memory cell MC are controlled independently of each other, two select signal generating circuits 890 are provided to correspond to the two cell strings CS1 and CS2. For example, the select signal generating circuits 890 are formed by the use of a shift register circuit and a decoder circuit.

Hereinafter, the memory cell or the unit cell to program (write/erase) data in and to read data from is referred to as a selected cell, and the memory cells (or the unit cells) other than the selected cell are referred to as unselected cells.

The other end of the first cell string CS1 is connected to the other end of the second cell string CS2, and the connection node NDR of the two cell strings CS1 and CS2 is the output terminal (read node) NDR of the memory circuit 110A.

The switch circuit 9 is connected to the output terminal NDR of the memory circuit 110A. For example, the switch circuit 9 is a switch element (e.g., field effect transistor) in the switch block 102.

The data (configuration information regarding the FPGA) from the memory cell MC is supplied to the input terminal (control terminal) of the switch circuit 9 as an output signal of the memory circuit 110A. The switch circuit 9 is turned on or off on the basis of the supplied data (e.g., an "H" or "L" level signal). When the switch circuit 9 is turned on, the logic elements (logic gates) LE connected to both ends of the current path (signal path) of the switch circuit 9 are connected to each other. When the switch circuit 9 is turned off, the logic elements LE connected to both ends of the current path of the switch circuit 9 are disconnected from each other.

However, the current path (output node) of the switch circuit 9 may be connected to the gate of the switch element (e.g., n-type transistor) provided in the switch block 102 in FIG. 4, or may be connected to the input terminal/control terminal of the multiplexer 120. The output terminal of the memory circuit 110A may be connected to the input terminal/control terminal of the multiplexer 120 via the current path of the transistor.

For example, the switch circuit 9 is connected to the cell strings CS1 and CS2 via the current path of the field effect transistor 4. For example, the field effect transistor 4 electrically disconnects the cell strings CS1 and CS2 from the switch circuit 9 during the operation of writing into the memory circuit 110A. The field effect transistor 4 electrically connects the cell strings CS1 and CS2 to the switch circuit 9 during the operation of reading into the memory circuit 110A.

For example, a first polarity terminal T1 of a resistance change element 1A as the memory element in the first cell string CS1 is disposed on one end side (first drive circuit side) of the cell string CS1, and a second polarity terminal T2 of the resistance change element 1A is disposed on the connection node NDR side of the two cell strings CS1 and CS2. A first polarity terminal T1 of a resistance change element 1B as the memory element in the second cell string CS2 is disposed on one end side (second drive circuit side) of the cell string CS2, and a second polarity terminal T2 of the resistance change element 1B is disposed on the connection node NDR side. Thus, the arrangement of the terminals T1 and T2 of the resistance change element 1A of the cell string CS1 is reverse to the arrangement of the terminals T1 and T2 of the resistance change element 1B of the cell string CS2 with respect to the connection node NDR in the two cell strings CS1 and CS2.

One memory cell MC stores data (hereinafter referred to as context) used to enable a certain logic (connection between the logic elements). The number of the memory cells MC in the memory circuit (memory block) corresponds to the number of contexts storable in the memory circuit 110A.

In the memory circuit 110A included in the FPGA according to the present embodiment, the two memory elements 1A and 1B of the memory cell MC are brought to a data retaining state (written state/erased state) complementary to each other.

That is, when the resistance state of the resistance change element 1A as the memory element 1A of the first unit cell UCA is the low-resistance state ("L" state, on-state, written state) in the first and second unit cells UCA and UCB of a certain memory cell MC, the resistance state of the resistance change element 1B as the memory element 1B of the second unit cell UCB is the high-resistance state ("H" state, off-state, erased state). On the other hand, when the resistance state of the resistance change element 1A is the high-resistance state in the memory cell MC, the resistance state of the resistance change element 1B is the low-resistance state.

In a transient state during data writing, the resistance states of the resistance change elements 1A and 1B as the two memory elements in one memory cell MC may be the same. However, in a configuration information retaining state, the two resistance change elements 1A and 1B of the memory cell MC in which data is correctly written are in the resistance states (different resistance states) complementary to each other.

When the data in the memory cell MC including the two unit cells UCA and UCB is read, the select transistors 2A and 2B of the unit cells UCA and UCB in the selected cell to be read are turned off by the control signal CNT from the select circuit 89. As a result, the memory elements 1A and 1B in the unit cells UCA and UCB serve as the current paths of a read pulse (voltage/current pulse) in the unit cells UCA and UCB.

As described above, the resistance states of the resistance change elements 1A and 1B as the memory elements are set so that the resistance states of the resistance change elements 1A and 1B in the memory cell MC are different from each other. Therefore, in the present embodiment, the difference of resistance value between the two resistance change elements 1A and 1B is substantially treated as data (e.g., one-bit data) stored in the memory cell MC.

For example, when the resistance state of the resistance change element of the high-potential-side unit cell is the high-resistance state and the resistance state of the resistance change element of the low-potential-side unit cell is the low-resistance state during data reading, the potential of the node NDR of the cell strings CS1 and CS2 is a ground potential. Therefore, the output signal from the memory circuit 110A is at the "L" level. Contrarily, when the resistance state of the resistance change element of the high-potential-side unit cell is the low-resistance state and the resistance state of the resistance change element of the low-potential-side unit cell is the high-resistance state, the potential of the node NDR of the cell strings CS1 and CS2 is at the about the same intensity as the read voltage $V_{OP}$. Therefore, the output signal from the memory circuit 110A is at the "H" level.

Details of the operations of writing and reading data in the memory elements 1A and 1B in the memory cell MC composed of the two unit cells UCA and UCB will be described later. Hereinafter, the operation of reading data in the memory circuit 110A (the memory cell MC) for outputting the configuration information (context) regarding the FPGA is also referred to as an FPGA operation.

As described above, the memory circuit 110A is used as the configuration memory of the multi-context type FPGA.

When the memory cell MC uses the two resistance change elements 1A and 1B in the resistance states (written state/erased state) complementary to each other as the memory elements 1A and 1B as in the memory circuit 110A shown in FIG. 5, it is preferable that the resistance change elements which are high in the ratio (on-off ratio) between the resistance value (on-resistance) of the low-resistance state of the resistance change element and the resistance value (off-resistance) of the high-resistance state are used as the memory elements 1A and 1B. For example, when the "H" level to be input to a CMOS circuit has a value equal to or more than 80% of a power supply voltage, the on-off ratio (off-resistance/on-resistance) is preferably equal to or more than four times. Moreover, when the output signal (data) of the memory circuit 110A is output via the n-type transistor 4, the on-off ratio of the resistance change element is preferably higher in consideration of a voltage drop resulting from the threshold value of the n-type transistor 4. As the resistance change element which allows a higher on-off ratio, it is preferable to use the above-mentioned oxidation-reduction resistance change element or ion-conducting resistance change element as the memory element of the memory circuit 110A.

Figure 6:
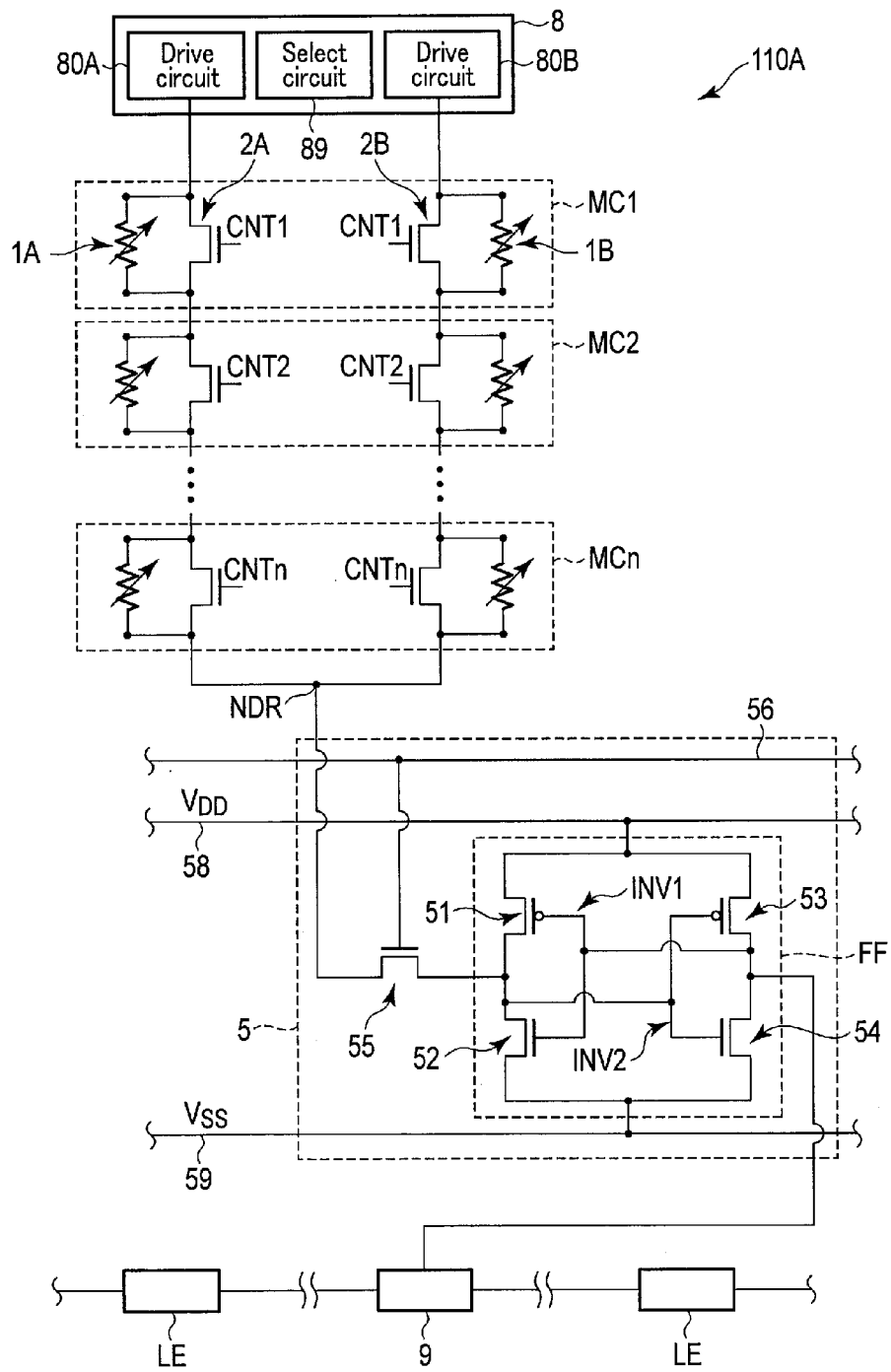

FIG. 6 is a diagram showing a modification of the memory circuit included in the FPGA according to the present embodiment.

As shown in FIG. 6, the memory circuit 110A in the FPGA may be connected to the switch circuit 9 via an SRAM (flip-flop circuit).

The node NDR as the output terminal of the memory circuit 110A is connected to a memory cell (hereinafter referred to as an SRAM cell) 5 of the SRAM. The SRAM cell 5 can temporarily retain the data output from the memory circuit 110A.

The SRAM cell 5 includes a flip-flop FF as a data storage unit, and a transfer gate 55 for controlling data transfer between the flip-flop FF and the memory circuit (memory cell) 110A.

The flip-flop FF includes two inverters INV1 and INV2 which are made a flip-flop connection. The current paths of a p-type transistor 51 and an n-type transistor 52 of one inverter INV1 are connected in series between a power supply line 58 to which a power supply voltage $V_{DD}$ is applied and a ground line 59 to which a ground voltage $V_{SS}$ is applied. The current paths of a p-type transistor 53 and an n-type transistor 54 of the other inverter INV2 are connected in series between the power supply line 58 and the ground line 59. The input node of the inverter INV1 is connected to the output node of the inverter INV2. The input node of the inverter INV2 is connected to the output node of the inverter INV1.

The current path of the transfer gate (e.g., n-type transistor) 55 is connected to the input node of the inverter INV2 (the output node of the inverter INV1). The control terminal (gate) of the transfer gate 55 is connected to a read control line 56. The transfer gate 55 is turned on or off in accordance with the signal level of the read control line 56.

The output terminal (read node) NDR of the memory circuit 110A is connected to the input node of the SRAM cell 5 via the current path of the transfer gate 55 of the SRAM cell 5. The output node of the SRAM cell 5 is connected to the control terminal of the switch circuit 9.

When the transfer gate 55 of the SRAM cell 5 is turned on, the flip-flop FF of the SRAM cell 5 is conducted to the memory circuit 110A. As a result, the output signal of the memory circuit 110A is transferred to the switch circuit 9 via the SRAM cell 5 during the read operation (FPGA operation) of the memory circuit 110A.

Thus, the data stored in the memory circuit 110A of the FPGA is output to the switch circuit 9 via the SRAM cell 5, so that the output signal of the memory circuit 110A is amplified by the SRAM cell 5. As a result, a signal at a level sufficient to turn on/off the switch circuit 9 can be supplied to the switch circuit 9 from the memory circuit 110A via the SRAM cell 5.

In the case where the power supply line (VDD) 58 remains supplied when the transfer gate 55 is turned on, it is preferable that the amount of current that can be passed by the memory circuit 110A is higher than the on-current of the p-type transistor 51 or the on-current of the n-type transistor 52 to change the data in the flip-flop FF. Thus, in this case, it is preferable that the on-resistance that can be taken by the resistance change element 1A is lower than at least the on-resistances of the transistors 51 and 52.

For example, when the transfer gate 55 is turned on by the read control line 56, the power supply line (VDD) 58 operates together so that the node can have the same potential as the ground line (VSS) 59, and when the transfer gate 55 is then turned off, the power supply line 58 operates together so that a power supply voltage is supplied to the node. In this instance, even if the on-off ratio of the resistance change element 1A is about two times higher, the data in the flip-flop FF can be changed. In this case, a control circuit may be provided in the power supply line 58 as in the read control line 56.

As shown in FIG. 7, the output terminal of the memory circuit 110A may be connected to the switch circuit 9 via an inverter 5Z in accordance with the characteristics (threshold voltage) of the switch circuit 9.

The output signal of the memory circuit 110A in FIG. 7 is supplied to the switch circuit 9 via the inverter 5Z. The output signal of the memory circuit 110A is amplified by the inverter 5Z, and the amplified signal is supplied to the switch circuit 9.

Thus, the resistance change element 1 as the memory element of the memory cell MC has a certain degree of on-off ratio. However, when the intensity of the output signal of the memory circuit 110A correlated with the on-off ratio is insufficient for the operation of the switch circuit 9, the output signal of the memory cell MC can be amplified by the inverter 5Z to the intensity sufficient to drive the switch circuit 9.

Instead of the inverter 5Z, a buffer circuit may be connected between the output terminal of the memory circuit 110A and the switch circuit 9.

As described above, in the memory circuit 110A in the FPGA according to the first embodiment, the current paths of the unit cells UC including the resistance change element 1 as the memory element are connected in series. Thus, the FPGA according to the present embodiment can reduce leak currents of the unit cells UC of the memory circuit 110A and the memory cell MC composed of the unit cells UC.

As a result, the reconfigurable logic circuit according to the first embodiment can reduce power consumption.

(b) Operation

The operation of the reconfigurable logic circuit according to the first embodiment is described with reference to FIG. 8 to FIG. 10.

<Write Operation>

A data write operation (program operation) in the memory circuit included in the reconfigurable logic circuit (e.g., FPGA) according to the first embodiment is described with reference to FIG. 8 and FIG. 9.

First, a basic operation of writing and erasing data in the memory element 1 of the unit cell UC is described.

As has been described with reference to FIG. 2 and FIG. 5, the select signal SS is supplied as the control signal CNT to the memory cell/unit cell (selected cell) to write data into the memory cells MC in the memory circuit 110A when data is written and erased in the memory circuit 110A used in the FPGA. The unselect signal uSS is supplied as the control signal CNT to the memory cells/unit cells (unselected cells) other than the selected cell among the memory cells.

The select signal SS as the control signal CNT is a signal (e.g., an "L" level signal) having a voltage value to turn off the select transistor 2 of the unit cell UC. On the other hand, the unselect signal uSS as the control signal CNT is a signal (e.g., an "H" level signal) having a voltage value to turn on the select transistor 2.

The select transistor 2 in the unselected cell to which the unselect signal uSS is supplied is sufficiently on. The select transistor 2 in which a channel (inversion layer) is formed is sufficiently low in resistance.

Therefore, the potential difference between the source and drain of the select transistor 2 that is on is nearly zero. The potential difference between the terminals T1 and T2 of the memory element 1 connected in parallel to the current path (channel) of the select transistor 2 is also substantially zero, and almost no current is supplied to the memory element 1. Thus, no data is written or erased in the resistance change element 1 as the memory element 1 in the unselected cell.

On the other hand, the select transistor 2 in the selected cell to which the select signal SS is supplied is sufficiently off. That is, no channel is formed in the current path of the select transistor 2, and the select transistor 2 functions as a sufficiently high resistance.

Therefore, a potential difference corresponding to the write voltage $V_{WR}$ from the write power supply or the erase voltage $V_{ER}$ from the erase power supply is applied across the source and drain of the select transistor 2.

As a result, the potential difference corresponding to the write voltage $V_{WR}$ or the erase voltage $V_{ER}$ is applied across both the terminals T1 and T2 of the memory element (resistance change element) 1 connected in parallel to the current path of the select transistor 2, and the resistance state of the resistance change element 1 as the memory element 1 changes.

When the resistance state of the resistance change element 1 to which the write voltage $V_{WR}$ is applied is the high-resistance state (erased state), the resistance state of the resistance change element 1 changes from the high-resistance state to the low-resistance state. When the resistance state of the resistance change element 1 to which the erase voltage $V_{ER}$ is applied is the low-resistance state (written state), the resistance state of the resistance change element 1 changes from the low-resistance state to the high-resistance state.

Depending on the characteristics/kind of the resistance change element 1, the pulse shape (at least one of the voltage value and pulse width) of the erase voltage $V_{ER}$ is different from the pulse shape of the write voltage $V_{WR}$, or the polarity of the write voltage $V_{WR}$ is opposite to the polarity of the erase voltage $V_{ER}$ (i.e. $V_{ER}=-V_{WR}$).

When the two terminals of the resistance change element 1 have opposite polarities and the resistance state of the resistance change element 1 changes in response to the voltages/currents having the opposite polarities, the voltage having the same polarity (e.g., a positive voltage) can be used to change the resistance state of the resistance change element 1 by switching the supply direction of the voltage/current (program pulse) to the resistance change element 1 as the memory element, that is, the relation between the source side (high-potential-side) and the sink side (low-potential-side) of the voltage/current with respect to the resistance change element 1. In this case, the polarity of the erase voltage can be the same as the polarity of the write voltage.

Thus, the resistance change element 1 as the memory element 1 of the unit cell UC in the memory circuit 110A of the FPGA according to the present embodiment is brought to the written state and the erased state by the program operation in the memory cell/unit cell. As a result, data corresponding to the written state or the erased state of the resistance change element 1 is programmed into the memory cells MC and the unit cells UC.

The resistance change element 1 used as the memory element 1 is subjected to an operation called forming before data writing and erasing in accordance with the kind of resistance change element. A fine current path called a filament is formed in an insulating film of, for example, a metal oxide in the resistance change element 1 by the forming, and the resistance change element which changes in resistance state between the low-resistance state and the high-resistance state is obtained. The forming operation can be performed substantially in the same manner as the above-described program operation for the memory cells/unit cells. However, the intensities of the voltage and current supplied to the resistance change element for the forming may be different from the intensities of the write voltage and the erase voltage.

When the memory cell MC including the two memory elements 1A and 1B stores context (one-bit data) in accordance with the data retention states of the two memory elements 1A and 1B complementary to each other (different resistance states of the two resistance change elements) as in the memory circuit included in the FPGA according to the present embodiment, the operation of writing data into the memory cell MC is performed as below.

Figure 9:
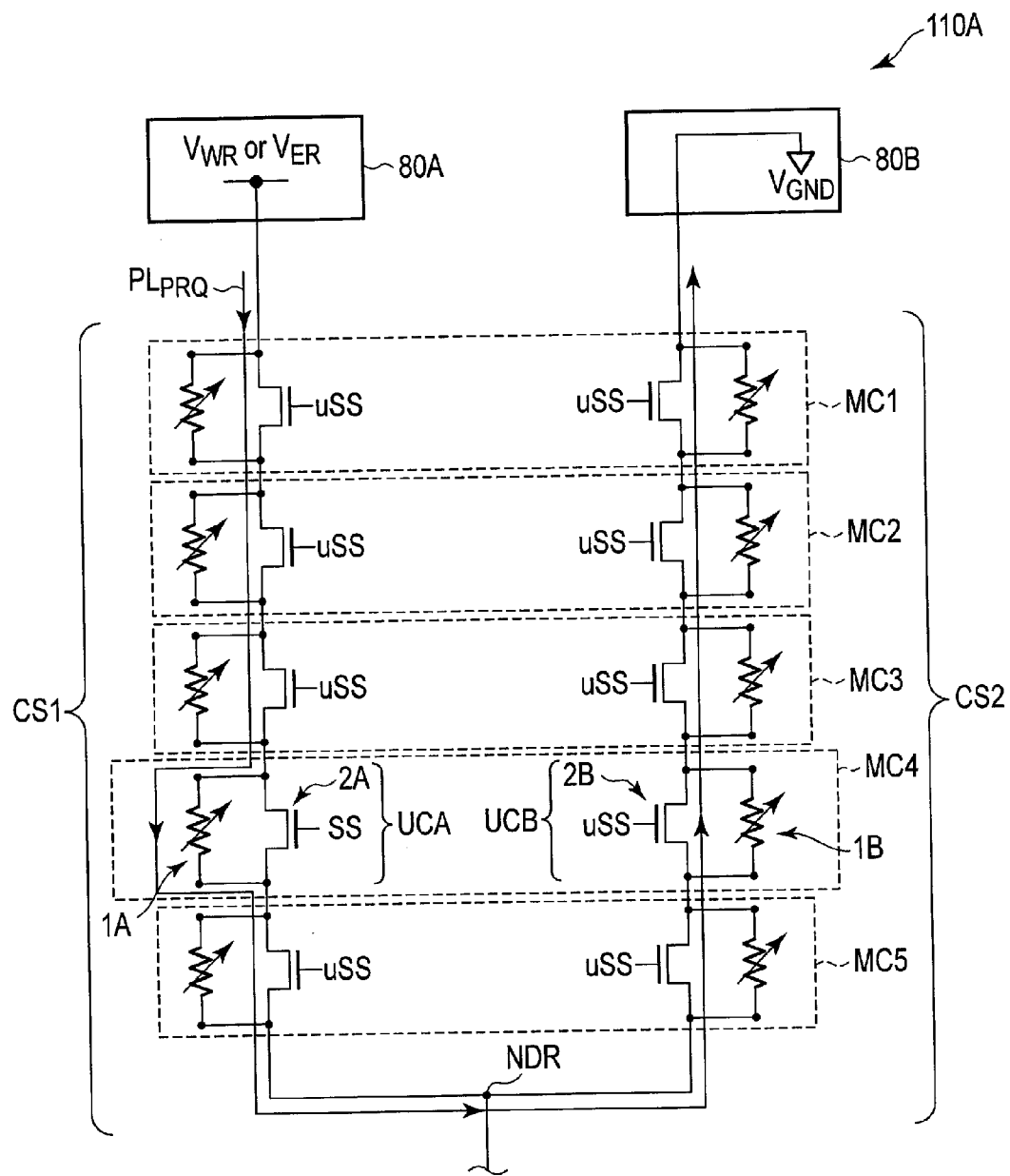

FIG. 8 and FIG. 9 are schematic diagrams illustrating the write operation in the memory circuit 110A of the FPGA in FIG. 5. In FIG. 8 and FIG. 9, the main parts of the circuits used for data writing and erasing in the memory circuit 110A included in the FPGA are extracted and shown.

In the example shown in FIG. 8 and FIG. 9, the memory circuit 110A used in the FPGA includes five memory cells MC1, MC2, MC3, MC4, and MC5. Each of the memory cells MC1, MC2, MC3, MC4, and MC5 is composed of two unit cells UC, and includes two memory elements (resistance change elements) 1 and two select transistors 2. Here, the write operation in the memory circuit is described on the assumption that the fourth memory cell MC4 is a selected cell and the first, second, third, and fifth memory cells MC1, MC2, MC3, and MC5 are unselected cells.

When the resistance change element (e.g., an MTJ element or a bipolar type resistance change element) which does not require the forming is used as the memory element 1, data is written into the memory cell MC including the two memory elements 1A and 1B by the operation of the memory circuit in the FPGA shown in FIG. 8.

As shown in FIG. 8, the memory circuit 110A in the FPGA including the resistance change element which does not require the forming as the memory element 1 can bring the two memory elements 1A and 1B in the selected cell (here, the memory cell MC4) into the data retention states (different resistance states) complementary to each other substantially at the same time.

For example, during the programming in the memory circuit 110A in the FPGA, the write power supply $V_{WR}$ is connected to the cell string CS1 via the switch element 800 in the on-state, and the ground terminal $V_{GND}$ is connected to the cell string CS2 via the switch element 804 in the on-state.

For each of the unselected cells MC1, MC2, MC3, and MC5, the unselect signal uSS is supplied to both the two unit cells UCA and UCB, and the select transistor 2 in each of the unselected cells is turned on by the unselect signal uSS at the "H" level.

For the two unit cells UCA and UCB of the memory cell MC4, the select signal SS as the control signal CNT is supplied to both the unit cells UCA and UCB. The two select transistors 2A and 2B in the memory cell are turned off by the select signal SS at the "L" level.

In the memory circuit 110A in FIG. 8, the cell strings CS1 and CS2 are formed so that in each of the cell strings CS1 and CS2, the first polarity terminal T1 of each of the resistance change elements 1A and 1B is located on the drive circuit side, and the second polarity terminal T2 of each of the resistance change elements 1A and 1B is located on the read node (the output terminal of the memory circuit 110A) NDR side. The resistance change element 1A in the cell string CS1 and the resistance change element 1B in the cell string CS2 are arranged in the memory block so that the polarities of the terminals T1 and T2 of the elements 1A and 1B are symmetrical with respect to the node NDR.

Because of the write power supply $V_{WR}$ and the ground terminal $V_{GND}$ that are connected, the first polarity terminal T1 is located on the high-potential-side, and the second polarity terminal T2 is located on the low-potential-side in the resistance change element 1A inside the first cell string CS1 when the drive circuit 80A on the first cell string CS1 side is on the high-potential-side (source side) and the drive circuit 80B on the second cell string CS2 side is on the low-potential-side (sink side). On the other hand, in the resistance change element 1B inside the second cell string CS2, the second polarity terminal T2 of the resistance change element 1B is located on the high-potential-side, and the first polarity terminal T1 of the resistance change element 1B is located on the low-potential-side.

Thus, the directions of the terminals T1 and T2 of the resistance change element 1 are set so that regarding the voltage supply side, the polarity of the voltage applied to the resistance change element 1B inside the second cell string CS2 is opposite to the polarity of the voltage applied to the resistance change element 1A inside the first cell string CS1.

Therefore, in the resistance change element 1A inside the first cell string CS1, a program pulse (write pulse) $PL_{PRG}$ as the write voltage or the write current is supplied from the first polarity terminal T1 of the resistance change element 1A to the second polarity terminal T2. In contrast, in the resistance change element 1B inside the second cell string CS2, the program pulse $PL_{PRG}$ is supplied in a direction from the second polarity terminal T2 to the first polarity terminal T1 of the resistance change element 1B. Therefore, the program pulse $PL_{PRG}$ as the erase voltage or the erase current (erase pulse) is supplied to the resistance change element 1B.

Thus, the write current flows in opposite directions through the resistance change elements 1A and 1B having the polarities as the memory elements, so that the resistance states of the resistance change elements 1A and 1B of the two unit cells UCA and UCB in the memory cell MC are brought to different states by the supplied write pulse $PL_{PRG}$.

As a result, data is stored in the memory cell MC by the supplied write pulse $PL_{PRG}$.

When the data to be written into the memory cell MC is data reverse to the data to be written in the operation in FIG. 8, the second cell string CS2 side is set to the high-potential-side, and the first cell string CS1 is set to the low-potential-side, in contrast to the relation of the high-potential-side and the low-potential-side in FIG. 8.

That is, when the resistance state of the resistance change element 1 is changed by the voltages having opposite polarities, it is preferable that the power supply terminal $V_{WR}$ for outputting the voltage $V_{WR}$ having the same polarity (e.g., a positive voltage) to the cell strings CS1 and CS2 is provided in each of the drive circuits 80A and 80B at one end side and the other end side of the cell strings CS1 and CS2, as shown in FIG. 8. For each power supply terminal $V_{WR}$, the transistors 800 and 803 are provided in the drive circuits 80A and 80B. The ground terminals $V_{GND}$ and the switch elements 802 and 804 are provided in both the drive circuits 80A and 80B.

As described above, the resistance change element 1A inside the first cell string CS1 and the resistance change element 1B inside the second cell string CS2 in FIG. 8 are connected between the two drive circuits 80A and 80B with respect to the node NDR so that the directions of the polarities of the terminals T1 and T2 of the resistance change element to the source side of the program pulse $PL_{PRG}$ between the source side and sink side of the program pulse $PL_{PRG}$ are opposite to each other.

Therefore, when the drive circuit 80A on the first cell string CS1 side is on the source side (high-potential-side, voltage output side) and the drive circuit 80B on the second cell string CS2 side is on the sink side (low-potential-side, ground side), the pulse $PL_{PRG}$ having the polarity corresponding to the write voltage is supplied to the resistance change element 1A inside the cell string CS1, and the pulse $PL_{PRG}$ having the polarity corresponding to the erase voltage is supplied to the resistance change element 1B inside the cell string CS2. As a result, the resistance state of the resistance change element 1A is brought to the written state (low-resistance state), and the resistance state of the resistance change element 1B is brought to the erased state (high-resistance state).

On the other hand, when the drive circuit 80A on the cell string CS1 side is the sink side and the drive circuit 80B on the cell string CS2 side is the source side, the pulse $PL_{PRG}$ having the polarity corresponding to the write voltage is supplied to the resistance change element 1B inside the second cell string CS2, and the pulse $PL_{PRG}$ having the polarity corresponding to the erase voltage is supplied to the resistance change element 1A inside the first cell string CS1 even if the voltage $V_{WR}$ having the same polarity as that when the cell string CS1 side is the source side is supplied to the cell string CS2 from the drive circuit 80A. Thus, the resistance state of the resistance change element 1A is brought to the erased state, and the resistance state of the resistance change element 1B is brought to the written state.

Thus, during programming in the memory circuit 110A in the FPGA, the source side and the sink side of the program pulse $PL_{PRG}$ for the cell strings CS1 and CS2 are switched, so that the resistance states of the resistance change elements 1A and 1B as the memory elements in the memory cell MC can be changed to states different from each other by the use of the voltage pulse (or current pulse) having the same polarity (pulse shape).

Accordingly, in the memory circuit 110A in the FPGA, the circuit (voltage generating circuit) for generating the write voltage and the erase voltage can be simpler, and, for example, the circuit for generating a negative voltage as the erase voltage can be reduced. As a result, the circuit designs of the drive circuits 80A and 80B of the memory circuit 110A used in the FPGA can be simpler, and the drive circuits 80A and 80B can be reduced in size.

For example, of the two resistance change elements 1A and 1B as the memory elements in the memory cell MC, the resistance change element 1A inside the first cell string is brought to the written state (low-resistance state) and the resistance change element 1B on the second cell string CS2 side is brought to the erased state (high-resistance state) by the operation in FIG. 8. In this case, data "0" is written into the memory cell MC. Contrarily, when the resistance change element 1A inside the first cell string is brought to the erased state and the resistance change element 1B on the second cell string CS2 side is brought to the written state, data "1" is written into the memory cell MC.

When the resistance change element for which the forming operation is not performed is used as the memory element as shown in FIG. 8, the unit cells UCA and UCB are designed so that the directions of the terminals T1 and T2 having the polarities of the resistance change element 1 to the supply direction of the voltage/current pulse are opposite to each other in the memory cell MC composed of the two unit cells UCA and UCB as in the memory circuit 110A in FIG. 5. Thus, the resistance states of the resistance change elements 1A and 1B of the two unit cells UCA and UCB can be changed substantially at the same time by the common voltage/current pulse, and data can be programmed in the memory cell MC by one supply of the write pulse.

As in FIG. 8, the resistance states of the memory elements 1 in the unit cells are changed by one supply of the write pulse, and the power consumption during writing and erasing (programming) in the memory circuit included in the FPGA can be reduced. Moreover, by simultaneously changing the resistance states of the memory elements 1, the data writing time can be reduced, and a high-speed writing and erasing operation (program operation) of the memory circuit included in the FPGA can be performed.

When the resistance states of the two resistance change elements of the two unit cells in the memory cell can be simultaneously changed as in the operation example of the memory circuit in the FPGA shown in FIG. 8, a common control signal CNT (SS, uSS) may be supplied from the interconnect common to the two unit cells UCA and UCB in one memory cell MC. In this case, the gates of the select transistors 2A and 2B are connected to the common interconnect (control signal line). In this case, the select circuit in the control circuit 8 is capable of common control of the two unit cells UCA and UCB in the memory cell, and therefore has only to include, for example, one select signal generating circuit 890.

When a resistance change element (e.g., a unipolar type resistance change element) which is subjected to the forming to develop the properties of changing the resistance state in the element is used as the memory element 1 of the memory circuit 110A, data is written or erased in the memory element 1 for each unit cell UC in the memory cell MC by the operation shown in FIG. 9.

One of the write power supply $V_{WR}$ and the erase power supply $V_{ER}$ in the drive circuit 80A serving as the source side is connected to the cell string CS1. The ground terminal $V_{GND}$ in the drive circuit 80B serving as the sink side is connected to the cell string CS2.

For each of the unselected cells MC1, MC2, MC3, and MC5, the unselect signal uSS is supplied to both the two unit cells UCA and UCB, and the select transistor 2 in each of the unselected cells is turned on by the unselect signal uSS.

The select signal SS as the control signal CNT is supplied to one (here, the unit cell UCA) of the two unit cells UCA and UCB of the memory cell MC4, and the unselect signal uSS is supplied to the other unit cell UCB.

As a result, only one select transistor 2A of the two select transistors 2A and 2B in the selected cell MC4 is turned off, and the program pulse $PL_{PRG}$ resulting from the voltage $V_{WR}$ or the erase voltage $V_{ER}$ is supplied to the resistance change element 1A connected in parallel to the current path of the select transistor 2A in the off-state.

The other select transistor 2B of the two select transistors 2A and 2B in the memory cell MC4 is turned on, so that almost no program pulse $PL_{PRG}$ is supplied to the resistance change element 1B connected in parallel to the select transistor 2B in the on-state.

Thus, the resistance state of the resistance change element 1A as the memory element in one unit cell UCA of the two unit cells UCA and UCB in the memory cell MC4 changes to the written state or the erased state in accordance the pulse shape of the supplied program pulse (at least one of the voltage value and pulse width of the pulse). In this instance, the resistance state of the resistance change element 1B in the other unit cell UCB is maintained.

After the resistance state of the resistance change element 1A in one unit cell UCA of the two unit cells UCA and UCB in the selected cell MC4 has been changed, one unit cell UCA is brought to the unselected state, and the other unit cell UCB is brought to the selected state. The write pulse $PL_{PRG}$ is supplied to the resistance change element 1B so that the resistance state of the resistance change element 1B in the other unit cell UCB will be reverse to the resistance state of the resistance change element 1A, and data is written or erased in the resistance change element 1B in the unit cell UCB.

After the resistance state of the resistance change element 1A in the unit cell UCA has been changed, data is programmed into the memory cells MC including the two unit cells UCA and UCB by changing the resistance state of the resistance change element 1B in the unit cell UCB.

Thus, the on/off of the two unit cells UCA and UCB in the memory cell MC are controlled independently of each other, so that it is possible to prevent the program pulses (write pulses, erase pulses) $PL_{PRG}$ having the same pulse shape from being supplied to the two resistance change elements 1A and 1B in the selected cell at the same time.

As described above, when the resistance change element for which the forming operation is performed is used as the memory element as shown in FIG. 9, the resistance states of the resistance change elements 1A and 1B are sequentially changed for each of the unit cells UCA and UCB in the memory cell MC composed of the two unit cells UCA and UCB as in the memory circuit 110A in FIG. 5, and data is thereby written into the memory cell MC.

When the resistance states of the resistance change elements are changed for each of the unit cells as in the example shown in FIG. 9, the gates of the select transistors 2A and 2B are connected to the interconnects (control signal lines) which are controlled independently of each other so that the control signals are supplied to the two unit cells UCA and UCB in one memory cell MC from different interconnects. For example, the select circuit in the control circuit 8 includes two select signal generating circuits 890 so that the two unit cells UCA and UCB in the memory cell can be independently controlled.

When the resistance change element for which the forming is not performed is used as the memory element 1 of the memory cell/unit cell MC, UC, the resistance states of the resistance change elements may be changed for each of the unit cells UCA and UCB and data may be then programmed in the memory cell including two resistance change elements as in the operations of writing and erasing in the memory circuit in the FPGA in FIG. 9 to prevent a write failure resulting from the voltage drop/current consumption of the program pulse by the resistance change element 1 in the selected cell in accordance with the intensity of the on-resistance and off-resistance of the resistance change element 1 as the memory element 1. The operations of writing and erasing in the memory circuit in the FPGA in FIG. 8 may be performed for the resistance change element for which the forming is performed, in accordance with the kind and characteristics of the resistance change element used as the memory element.

During data writing/erasing, as in the memory circuit in the FPGA in FIG. 5, the switch circuit 9 is electrically separated from the memory circuit 110A by the transistor 4 between the output terminal of the memory circuit 110A and the switch circuit 9. Therefore, the write/erase voltage (or current) during data writing/erasing is hardly supplied to the switch circuit 9.

The two memory elements (resistance change elements) in the memory cell in the memory circuit 110A are set to the data retention states (different resistance states) complementary to each other by the writing operation in the memory circuit 110A in the FPGA shown in FIG. 8 and FIG. 9, so that data (context, one-bit data) can be stored in the memory cell MC, and the configuration information for constructing the logic circuit capable of performing a predetermined logic operation can be stored in the memory circuit in the FPGA.

<Read Operation>

A read operation (FPGA operation) in the memory circuit included in the reconfigurable logic circuit (e.g., FPGA) according to the first embodiment is described with reference to FIG. 10.

First, a basic operation of reading data from the memory element 1 of the unit cell UC is described.

During data reading (FPGA operation) in the memory circuit 110A in the FPGA, the select signal SS is supplied as the control signal to the memory cell/unit cell to read data among the memory cells/unit cells MC and UC in the memory circuit. The unselect signal uSS is supplied as the control signal to the unselected cells among the memory cells/unit cells.

As in the write operation in FIG. 8 and FIG. 9, the select signal SS in the read operation is a signal (an "L" level signal) having a voltage value to turn off the select transistor 2 of the unit cell UC. The unselect signal uSS in the read operation is a signal (an "H" level signal) having a voltage value to turn on the select transistor 2.

The select transistor 2 is turned on in the unselected cell to which the unselect signal uSS is supplied. Therefore, the current (hereinafter, a read current) generated by the read voltage $V_{OP}$ mostly flows through the channels of the select transistors 2A and 2B in the unit cell UC, and hardly flows through the resistance change element 1 as the memory element 1.

On the other hand, the select transistor 2 is turned off in the selected cell to which the select signal SS is supplied. Therefore, the read current resulting from the read voltage $V_{OP}$ is mostly supplied to the resistance change element 1 as the memory element 1.

The intensity of the current (or potential) supplied to the read node (the output terminal of the memory circuit) NDR of the memory circuit from the selected cell varies depending on whether the resistance change element 1 as the memory element 1 is in the high-resistance state or the low-resistance state.

The data stored in the selected cell of the memory circuit is determined by the intensity of the current (potential) in the read node NDR.

The switch circuit 9 is turned on or off depending on the current/potential in the read node NDR. The two logic elements LE are electrically connected by the switch circuit 9 in the on-state. The two logic elements LE are electrically disconnected by the switch circuit 9 in the off-state.

When the memory cell MC including the two memory elements 1A and 1B stores context information (one-bit data) in accordance with the data retention states of the two memory elements 1A and 1B complementary to each other (different resistance states of the two resistance change elements) as in the memory circuit 110A included in the FPGA according to the present embodiment, the operation of reading data from the memory cell MC (FPGA operation) is performed as below.

The resistance state of the resistance change element 1 as one of the two memory elements 1 of the memory cell MC is the high-resistance state, and the resistance state of the resistance change element 1 as the other memory element 1 is the low-resistance state.

Figure 10:
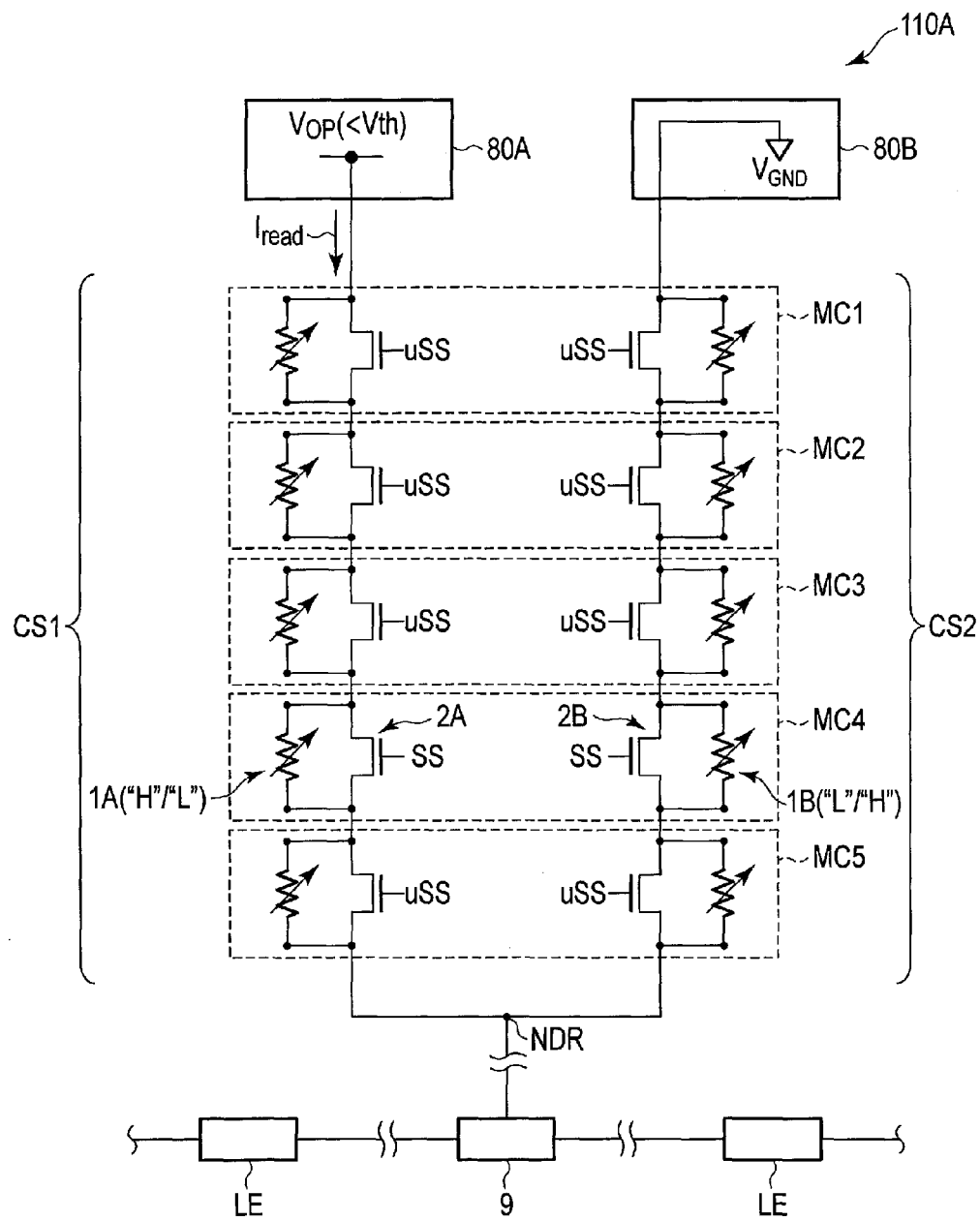

For example, in the read operation in the memory circuit 110A in the FPGA shown in FIG. 10, the first cell string CS1 side is set to the high-potential-side, and the second cell string CS2 side is set to the low-potential-side, when data is read from the selected cell (here, the memory cell MC4) in the memory circuit 110A in the FPGA according to the present embodiment. This case is described below. In FIG. 10, the main parts of the circuits used for data reading in the memory circuit 110A are extracted and shown.

During the read operation (FPGA operation) in the memory circuit 110A, the read power supply $V_{OP}$ ($<V_{th}$) and the ground power supply $V_{GND}$ are connected to the cell strings CS1 and CS2 via the switch element (not shown) in the on-state. A read current $I_{read}$ ($<I_{th}$) resulting from the read voltage $V_{OP}$ is supplied to the cell strings CS1 and CS2. During the read operation, the two select transistors 2 in the memory cell MC4 are turned off, and the two select transistors 2 in each of the unselected cells MC1, MC2, MC3, and MC5 are turned on.

As described above, in the memory circuit 110A in the FPGA according to the present embodiment, the two resistance change elements 1 in the memory cell MC are set to different resistance states.

In the present embodiment, when the resistance change element 1A on the first cell string CS1 side of the selected cell MC4 is in the high-resistance state, the resistance change element 1B on the second cell string CS2 side of the selected cell MC4 is in the low-resistance state.

In this case, the read voltage $V_{OP}$ supplied from the first cell string CS1 side is electrically separated from the read node NDR of the memory circuit 110A by the resistance change element 1A in the high-resistance state or consumed by a voltage drop resulting from the resistance change element 1A in the high-resistance state. The ground voltage $V_{GND}$ supplied from the second cell string CS2 side is transferred to the read node NDR by the resistance change element 1B in the low-resistance state.

As a result, when the high-potential-side resistance change element is in the high-resistance state among the two resistance change elements 1 as the memory elements in the memory cell MC to store complementary data during data reading (FPGA operation), the potential of the read node NDR of the memory circuit 110A is a low potential ("L" level).

On the other hand, when the resistance change element 1A on the first cell string CS1 side of the selected cell MC4 is in the low-resistance state, the resistance change element 1B on the second cell string CS2 side of the selected cell MC4 is in the high-resistance state.

In this case, the supply of the ground voltage $V_{GND}$ to the read node NDR is cut off by the resistance change element 1B in the high-resistance state, and the read voltage $V_{OP}$ from the first cell string CS1 side is transferred to the read node NDR via the resistance change element 1A in the low-resistance state.

Therefore, when the high-potential-side resistance change element 1 is in the low-resistance state among the two resistance change elements (memory elements) 1 in the memory cell MC to store complementary data during data reading, the potential of the read node NDR of the memory circuit 110A is a high potential ("H" level).

The switch circuit 9 is turned on or off by the potential of the read node NDR based on the data read from the memory cell MC. The logic elements LE connected to the switch circuit 9 are connected or disconnected depending on whether the switch circuit 9 is on or off.

Thus, in the read operation (FPGA operation) in the memory circuit 110A including the memory cell MC in which the two resistance change elements 1 in different resistance states each other (complementary data retention states) are used as the memory elements 1, data (context, configuration information) can be read from each memory cell MC, and the logic circuit capable of performing a predetermined logic operation can be constructed on the basis of the read data.

During the read operation (FPGA operation) in the memory circuit 110A included in the FPGA, the second cell string CS2 side may be set to the high-potential-side, and the first cell string CS1 side may be set to the low-potential-side in accordance with the configuration of the power supplies in the drive circuits 80A and 80B.

As described above, by the operations of writing/erasing and reading data in the memory circuit including the FPGA according to the first embodiment, the memory circuit 110A described in the present embodiment is driven as the configuration memory of the FPGA (e.g., a multi-context type FPGA).

(c) Characteristics of Memory Circuit

Characteristics of the memory circuit used for the reconfigurable logic circuit (e.g., FPGA) according to the first embodiment is described with reference to FIG. 11 and FIG. 12.

In the memory circuit 110A included in the FPGA according to the first embodiment, the on-resistance of the resistance change element 1 as the memory element (the resistance value of the element 1 in the low-resistance state) is associated with an operational delay in the memory circuit 110A, and the off-resistance of the resistance change element 1 (the resistance value of the element 1 in the high-resistance state) is associated with the power consumption of the memory circuit 110A.

The on-resistance of the resistance change element 1 is associated with the operational delay of the memory circuit 110A in the FPGA for the reason that it affects how quickly a current can flow through the resistance change element 1 when the resistance change element 1 is selected.

The off-resistance of the resistance change element is associated with the power consumptions of the memory circuit 110A and the FPGA including this memory circuit 110A for the reason that even when the off-resistances of the select transistors 2 having their current paths connected in series are high, more current flows on the resistance change element 1 side than on the select transistor 2 side and a leak current is generated in the unit cell UC (memory cell MC) if the off-resistance of the resistance change element 1 as the memory element is low.

The on-off ratio of the select transistor 2 of the unit cell UC also affects the characteristics of the memory circuit 110A. If the on-resistance of the select transistor 2 (the resistance value between the source and drain of the select transistor in the on-state) is high or if the off-resistance of the select transistor 2 (the resistance value between the source and drain of the select transistor 2 in the off-state) is low, the operation of the memory circuit 110A is delayed or a pass-through current increases even when the on-off ratio of the resistance value of the memory element 1 is high.

The relation between the intensities of the on-resistance and off-resistance of the resistance change element 1 as the memory element 1 used in the memory circuit 110A in the FPGA and the operational characteristics of the memory circuit 110A is described below.

FIG. 11 and FIG. 12 show circuit simulation results of the memory circuit used in the FPGA according to the embodiment.

FIG. 11 is a graph showing a simulation result of the relation between the off-resistance of the resistance change element as the memory element of the memory circuit in the FPGA according to the embodiment and the power consumption of the memory circuit (FPGA). The horizontal axis in the graph of FIG. 11 indicates the off-resistance (unit: $\Omega$) of the resistance change element by a logarithmic scale. The vertical axis in the graph of FIG. 11 indicates the power consumption (unit: %) of the memory circuit included in the FPGA. FIG. 11 shows simulation results for the memory circuits in the FPGAs according to the present embodiment that use, as the memory elements, a resistance change element having an on-resistance of 1 k$\Omega$, a resistance change element having an on-resistance of 10 k$\Omega$, and a resistance change element having an on-resistance of 100 k$\Omega$, respectively.

FIG. 11 shows the power consumption of the memory circuit included in the FPGA according to the present embodiment in the case where the power consumption of a parallel type memory circuit in an FPGA as a comparative example is indicated by 100% as a reference. The parallel type memory circuit is a memory circuit in which unit cells each including one memory element and one select transistor are connected in parallel between a power supply line and the output terminal (read node) of the memory circuit.

FIG. 12 is a graph showing a simulation result of the relation between the on-off ratio of the resistance change element as the memory element of the memory circuit in the FPGA according to the embodiment and the operational delay of the memory circuit.

The horizontal axis in the graph of FIG. 12 indicates the on-resistance (unit: $\Omega$) of the resistance change element as the memory element. The vertical axis in the graph of FIG. 12 indicates the delay ratio (unit: %) of the output signal of the memory circuit. In FIG. 12, the off-resistance of the resistance change element as the memory element of the memory circuit 110A is set to $1.0 \times 10^8$ k$\Omega$. In FIG. 12, the delay ratio of the output signal of the memory circuit in which the resistance change element having an on-resistance of 1 k$\Omega$ is used as the memory element is indicated by 100%.

As shown in FIG. 11, when the resistance change element which has a high off-resistance regardless of the value of the on-resistance of the resistance change element is used in the memory circuit 110A in the resistance change element having each on-resistance as in the memory circuit 110A included in the FPGA according to the present embodiment, the power consumption of the circuit in a standby state in which no data writing/reading is performed can be reduced.

If the off-resistance of the resistance change element 1 is equal to or more than $1.0 \times 10^8 \Omega$ (100 M$\Omega$), the power consumption of the memory circuit using each resistance change element hardly changes even when the intensity of the on-resistance of the resistance change element 1 is different. An off-resistance of $1.0 \times 10^8 \Omega$ in the resistance change element 1 is about one tenth of the off-resistance of the select transistor 2 used in the circuit simulation.

In FIG. 11, power consumption is lower in the memory circuits that use the resistance change elements lower in on-resistance. This is attributed to an extra operation time and power consumption that are produced by the prolonged operation resulting from the operational delay of the circuit shown in FIG. 12.

The memory circuit (serial type memory circuit) in the FPGA according to the present embodiment that uses, as the memory element, the resistance change element having an on-resistance of 1 k$\Omega$ and an off-resistance of 100 M$\Omega$ can reduce power consumption by about 40 percent compared with the parallel type memory circuit used in the FPGA according to the comparative example.

As shown in FIG. 12, the output of the memory circuit 110A is less delayed when the on-resistance of the resistance change element 1 as the memory element 1 is lower. For example, an on-resistance of 1 kΩ in the resistance change element 1 has the same value as the on-resistance of the select transistor 2 in the circuit simulation.

The conditions of the resistance change element 1 used as the memory element of the memory circuit 110A in the FPGA according to the present embodiment in accordance with the simulation results shown in FIG. 11 and FIG. 12 are shown in Relational Expressions (1) to (6) below. Here, in Relational Expressions (1) to (6) below, the power supply voltage (drive voltage) is represented by "$V_{dd}$", the on-current of the select transistor 2 is represented by and the off-current of the select transistor 2 is represented by "$I_{off}$". The on-resistance of the resistance change element 1 as the memory element 1 (the resistance value of the element 1 in the low-resistance state) is represented by "$R_{on}$", the off-resistance of the resistance change element 1 (the resistance value of the element 1 in the high-resistance state) is represented by "$R_{off}$", and the on-off ratio between the off-resistance and the on-resistance ($R_{off}/R_{on}$) is represented by "n".

The off-resistance $R_{off}$ and the on-resistance $R_{on}$ are represented as in (Expression 1) and (Expression 2) by the power supply voltage $V_{dd}$ and the off-current $I_{off}$ and the on-current $I_{on}$ of the select transistor 2.

$$R_{off} \geq V_{dd}/(10 \times I_{off}) \quad \text{(Expression 1)}$$

$$R_{on} \leq V_{dd}/I_{dsat} \quad \text{(Expression 2)}$$

Furthermore, (Expression 2) representing the relational expression of the on-resistance $R_{on}$ is represented by (Expression 3) below when represented by the use of a resistance ratio n.

$$R_{off} \leq nV_{dd}/I_{dsat} \quad \text{(Expression 3)}$$

On the basis of Relational Expressions (1) to (3), the range of the resistance value of the off-resistance is represented by the relational expression (Expression 4) below.

$$V_{dd}/(10 \times I_{off}) \leq R_{off} \leq nV_{dd}/I_{dsat} \quad \text{(Expression 4)}$$

When the condition in the relational expression below (Expression 5) in satisfied, the resistance change element as the memory element has a desired off-resistance $R_{off}$.

$$V_{dd}/(10 \times I_{off}) \leq nV_{dd}/I_{dsat} \quad \text{(Expression 5)}$$

On the basis of Relational Expressions (1) to (5), the condition of the resistance change element as the memory element used in the memory circuit of the FPGA according to the present embodiment is represented by (Expression 1) which shows the condition of the off-resistance $R_{off}$ of the resistance change element and by (Expression 6) which shows the condition of the on-off ratio of the resistance change element.

$$n \geq I_{dsat}/(10 \times I_{off}) \quad \text{(Expression 6)}$$

When the resistance change element having the conditions of (Expression 1) and (Expression 6) is used as the memory element 1 of the memory circuit 110A in the FPGA according to the present embodiment, the delay of the output signal of the memory circuit 110A can be reduced, and the power consumption of the FPGA can be reduced.

(d) Summary

In the reconfigurable logic circuit according to the embodiment, the memory circuit to store the configuration information regarding the reconfigurable logic circuit (e.g., FPGA) according to the embodiment includes the unit cells UC which each include the resistance change element 1 as the memory element 1 and the select element 2, and the current paths of the unit cells UC are connected in series. In each unit cell UC, the resistance change element 1 is connected in parallel to the current path of the select transistor 2 as the select element. The unit cell UC is used as a basic unit included in the memory cells MC of the memory circuit 110A in the FPGA.

In the memory circuit 110A used in the FPGA according to the present embodiment, the current paths of the unit cells UC (the current paths of the select transistors 2) are connected in series between interconnects (power supply lines), so that the flow of the current between adjacent unit cells is inhibited, and the leak current can be reduced, as compared to the case where the memory circuit in which a leak current is generated for each unit cell (memory cell) as in an SRAM or the parallel type memory circuit is used in the FPGA.

Therefore, the FPGA including the memory circuit 110A described in the present embodiment can reduce power consumption.

The resistance change element 1 used as the memory element of the memory circuit 110A in the FPGA according to the present embodiment can maintain a predetermined resistance state until a write voltage/current equal to or more than the threshold voltage/threshold current is applied. Thus, as in the present embodiment, the memory cell/memory cell MC, UC in which the resistance change element 1 is used as the memory element 1 can retain data substantially in a nonvolatile manner. The intensity of the voltage used to change the resistance state of the resistance change element 1 is lower than that of a write voltage of a memory cell (a floating gate type transistor or an MONOS transistor) of a flash memory. Thus, the characteristics of the resistance change element 1 used as the memory element of the memory circuit 110A in the FPGA also contribute to the lower power consumption of the FPGA according to the present embodiment.

In the memory circuit 110A included in the FPGA according to the embodiment, the unit cells UC to form the memory cell are connected in series, so that the components (e.g., the source and drain of the transistor) of the unit cell UC can be shared between adjacent cells. Miniaturization of the resistance change element 1 as the memory element is relatively easy. Therefore, compared to the SRAM and the parallel type memory circuit, the memory circuit 110A included in the FPGA according to the present embodiment can reduce the area of the circuit on the chip (semiconductor substrate). Moreover, the memory circuit 110A described in the present embodiment can be used in the configuration memory of the multi-context type FPGA, and can therefore reduce the chip cost of the FPGA. Therefore, according to the present embodiment, the chip costs for the FPGA according to the present embodiment and the LSI including this FPGA can be reduced.

As described above, the reconfigurable logic circuit according to the embodiment can reduce power consumption.

(3) Second Embodiment

A reconfigurable logic circuit (e.g., FPGA) according to the second embodiment is described with reference to FIG. 13 and FIG. 14. In the present embodiment, substantially the same components and functions as those according to the first embodiment are not repeatedly described.

FIG. 13 is an equivalent circuit diagram illustrating the circuit configuration of a memory circuit included in an FPGA according to the second embodiment.

A memory circuit 110B in the FPGA according to the second embodiment is different from the memory circuit in the FPGA according to the first embodiment in that one memory cell MC is formed by the use of one unit cell UC.

When the memory cell MC to store one-bit data is formed by only one unit cell UC, it is preferable that a drive circuit (read circuit) 6 to read data from the memory cell (unit cell) is provided in the memory circuit 110B of the FPGA as shown in FIG. 13.

The drive circuit (read circuit) 6 in a control circuit has a judging circuit (second circuit) 61 and a precharge circuit (first circuit) 62.

The judging circuit 61 is connected to, for example, one end of a cell string CS in the memory circuit 110B. The judging circuit 61 is formed by, for example, an n-type transistor. One end of the current path of the n-type transistor 61 is connected to a ground terminal $V_{GND}$, and the other end of the current path of the n-type transistor 61 is connected to one end of the current path of a select transistor 2 in the unit cell UC of the cell string CS.

The precharge circuit 62 is connected to, for example, the other end (read node side) of the cell string CS in the memory circuit 110B. The precharge circuit 62 is formed by, for example, a p-type transistor 62. One end of the current path of the p-type transistor 62 is connected to a power supply terminal $V_{OP}$, and the other end of the current path of the p-type transistor 62 is connected to the other end of the current path of a select transistor 2 in a unit cell UCn at the terminal (read node side) of the cell string CS.

A control signal PC is supplied to the gate of the n-type transistor 61 as the judging circuit 61 and to the gate of the p-type transistor 62 as the precharge circuit 62.

As shown in FIG. 13, drive circuits (write circuits) 80A and 80B to supply a write voltage/write current to each unit cell UC as the memory cell MC may be connected to one end and the other end of the cell string CS. A select circuit 89 which brings each unit cell UC as the memory cell MC into the selected state/unselected state may be connected to each unit cell UC.

The operation of reading data from the memory circuit 110B included in the FPGA according to the present embodiment (FPGA operation) is performed as below.

When data is read from the memory circuit 110B in the FPGA, the control signal PC is set to the "L" level. By the "L" level control signal, the p-type transistor 62 as the precharge circuit 62 is turned on, and the n-type transistor 61 as the judging circuit 61 is turned off. The power supply terminal (read voltage) $V_{OP}$ is supplied to the cell string CS of the memory circuit 110B via the p-type transistor 62 in the on-state. As a result, a read node NDR in the cell string CS is charged.

During the precharging of the cell string CS, by an "L" level control signal CNT, all the select transistors 2 in the cell string CS may be turned off, and the read node NDR alone may be charged. By an "H" level control signal CNT, all the select transistors 2 in the cell string CS may be turned on, and channel regions of all the select transistors 2 in the cell string CS may be charged. During the precharging of the cell string CS, the pulse shape of the power supply voltage $V_{OP}$ is controlled so that the resistance state of the resistance change element does not change due to the supply of the power supply voltage $V_{OP}$ for precharging.

After the precharging of the read node NDR of the memory circuit 110B, the control signal PC is set to the "H" level. By the "H" level control signal, the p-type transistor 62 is turned off, and the n-type transistor 61 is turned on. An "L" level select signal is supplied to the gate of the select transistor 2 of the selected unit cell (memory cell) UC, and an "H" level select signal is supplied to the gate of the select transistor 2 of the unselected unit cell UC.

At the same time, if the resistance state of the resistance change element 1 connected in parallel to the select transistor 2 in the selected cell to which the select signal ("L" level signal) is supplied is the high-resistance state (erased state), the potential of the read node NDR of the memory circuit in FIG. 13 is kept in the state of the power supply voltage $V_{OP}$. As a result, during the judgment of the charging/discharging of the node by the judging circuit 61, the potential of the read node NDR is brought to the "H" level, and the output signal of the memory circuit 110B is brought to the "H" level.

On the other hand, if the resistance state of the resistance change element 1 in the selected cell is the low-resistance state (written state), a current flows through the low-resistance resistance change element 1, and the read node NDR of the cell string CS changes from the charged state to the discharged state. As a result, the potential of the read node NDR is brought to the "L" level, and the output signal of the memory circuit 110B is brought to the "L" level.

Thus, the node NDR as the output terminal of the memory circuit 110B is precharged, and the potential of the read node NDR changes in accordance with the resistance state of the resistance change element 1 as the memory element of the selected cell. As a result, data stored in the memory cell MC is read as the change of the potential of the node NDR, and on the basis of this data, the on and off of a switch circuit 9 can be controlled.

During the writing of data into the memory circuit 110B included in the FPGA according to the present embodiment, the operation (e.g., the operation described with reference to FIG. 8 and FIG. 9) which is substantially similar to the operation of changing the resistance state of the resistance change element 1 in the first embodiment can be applied to the operation of changing the resistance state of the resistance change element 1 as the memory element depending on the characteristics of the resistance change element 1. Therefore, this operation is not described here.

One end of the cell string CS may be connected to the circuit (e.g., the p-type transistor) which controls the connection between the end (one end of the cell string) of the memory circuit 110B opposite to the node NDR and the power supply terminal $V_{OP}$, and the other end of the cell string CS may be connected to the circuit (e.g., the n-type transistor) which controls the connection between the node NDR (the other end of the cell string) of the memory circuit 110B and the ground terminal $V_{GND}$.

In this case, the operation of the switch circuit by the data stored in the memory circuit 110B is controlled as below.

The read node NDR of the memory circuit 110B is connected to the ground terminal $V_{GND}$ by the n-type transistor 61 (second circuit), and the read node NDR is brought to the discharged state. After the read node NDR is brought to the discharged state, the n-type transistor 61 is turned off. Then the select transistor 2 of the selected cell is turned off, and one end of the cell string CS is connected to the power supply terminal $V_{OP}$ by the p-type transistor (first circuit) 62 in the on-state. The read node NDR is connected to the power supply terminal $V_{OP}$ via the memory cells (unit cells). The power supply voltage $V_{OP}$ is supplied to the read node NDR via the memory element 1 in the resistance state corresponding to the data to be stored. The power supply voltage $V_{OP}$ supplied to the selected cell is stepped down in accordance with the resistance state of the memory element 1, and the potential of the read node NDR resulting from the power supply voltage $V_{OP}$ changes. Thus, the on/off of the switch circuit 9 is controlled in accordance with the data stored in the memory element 1 in the selected cell.

FIG. 14 is an equivalent circuit diagram showing the main parts of a modification of the memory circuit in the FPGA according to the second embodiment.

As shown in FIG. 14, the output terminal of the memory circuit 110B used in the FPGA according to the present embodiment may be connected to the switch circuit 9 via an SRAM cell (flip-flop) 5 for temporarily retaining data output from the memory circuit 110B, substantially in the same manner as the memory circuit 110A used in the FPGA according to the first embodiment in FIG. 6.

The output terminal of the memory circuit 110B according to the present embodiment may be connected to the switch circuit 9 via an inverter circuit or a buffer circuit, substantially in the same manner as the memory circuit 110A in FIG. 7.

In the memory circuit 110B included in the FPGA according to the present embodiment, the on-off ratio of the resistance change element 1 as the memory element may be low.

In the memory circuit 110B in the reconfigurable logic circuit according to the second embodiment as well, the unit cells UC included in the memory cell MC are connected in series. Therefore, the memory circuit 110B in the reconfigurable logic circuit according to the second embodiment can reduce the leak currents of the unit cells UC and the memory cell MC.

Therefore, the reconfigurable logic circuit according to the second embodiment can reduce power consumption.

(4) Third Embodiment

A reconfigurable logic circuit (e.g., FPGA) according to the third embodiment is described with reference to FIG. 15.

In the present embodiment, substantially the same components and functions as those according to the first and second embodiments are not repeatedly described.

FIG. 15 is an equivalent circuit diagram illustrating the circuit configuration of a memory circuit included in an FPGA according to the third embodiment.

As described above, it is preferable that in a memory element used in the memory circuit of the FPGA, the difference in the resistance values of a resistance change element between the high-resistance state and the low-resistance state is great, that is, the ratio between the on-resistance $R_{on}$ and the off-resistance $R_{off}$ of the resistance change element is high.

However, when a resistance change element having a low on-off ratio is used as the memory element of the memory circuit, a memory circuit 110C having a circuit configuration in FIG. 15 may be formed.

As shown in FIG. 15, the memory circuit 110C according to the third embodiment includes a read circuit (drive circuit) 7 including a sense amplifier circuit 70.

One end of a cell string CS is connected to a ground terminal $V_{GND}$ via an n-type transistor 79 as a switch element.

The other end (read node) NDR of the cell string CS is connected to a first input terminal (e.g., inverting input terminal) ITA of the sense amplifier circuit 70 via a bias circuit 71A.

A reference resistive element 73 is connected to a second input terminal (e.g., noninverting input terminal) ITB of the sense amplifier circuit 70 via a bias circuit 71B.

The resistance value of the reference resistive element 73 has an intermediate value between the resistance value of the resistance change element 1 in the low-resistance state and the resistance value in the high-resistance state. The reference resistive element 73 may be formed by an element that uses the same material as the resistance change element 1 as the memory element. The reference resistive element 73 may be formed by the use of polysilicon or silicide. The reference resistive element 73 having a predetermined resistance value may be formed by the serial/parallel connection of the resistance change elements 1.

An output terminal OT of the sense amplifier circuit 70 is connected to a switch circuit 9.

Thus, in the memory circuit 110C of the FPGA according to the present embodiment, the cell string CS in which unit cells UC are connected in series is connected to the switch circuit 9 via the sense amplifier circuit 70.

Data reading (FPGA operation) in the memory circuit 110C in the FPGA according to the third embodiment is performed as below.

When data is read from the memory circuit 110C included in the FPGA, a judging voltage (or current) is supplied to the cell string CS from the bias circuit 71A on the first input terminal ITA side via a transistor 4 in the on-state. A reference voltage (or current) is supplied to the reference resistive element 73 from the bias circuit 71B on the second input terminal ITB side.

An "L" level control signal (select signal) CNT is supplied to the select transistor 2 in the selected cell UC, and the select transistor 2 in the selected cell UC is turned off. As a result, in the selected cell UC, a current from the bias circuit 71A is supplied to the resistance change element 1 in the low-resistance state or high-resistance state. The select transistor 2 in the unselected cell UC is turned on by an "H" level control signal (unselect signal) CNT. In the unselected cell UC, the current from the bias circuit 71A flows through the channel of the select transistor 2 in the on-state.

The sense amplifier circuit 70 detects and compares the intensity of the current flowing through the resistance change element 1 in the selected cell UC with the intensity of the current flowing through the reference resistive element 73. The current difference between the current flowing through the reference resistive element 73 and the current flowing through the cell string CS (resistance change element) is amplified.

The current flowing through the resistance change element 1 in the low-resistance state is higher than the current flowing through the resistance change element 1 in the low-resistance state. The resistance value of the reference resistive element 73 and the output of the bias circuit 71B are adjusted so that the intensity of the current flowing through the reference resistive element 73 is lower than the current flowing through the resistance change element 1 in the low-resistance state and higher than the current flowing through the resistance change element 1 in the high-resistance state. Thereby, the intensity of the current flowing through the reference resistive element 73 is controlled.

A signal amplified by the sense amplifier circuit 70 is output to the switch circuit 9 from the output terminal OT of the sense amplifier circuit 70 as an output signal of the memory circuit 110C.

Thus, the output signal of the cell string CS is detected/amplified by the sense amplifier circuit 70, so that even if the on-off ratio of the resistance change element 1 as the memory element is low (about several times), the resistance state of the resistance change element 1 can be judged. As a result, the memory circuit 110C according to the present embodiment can read the data in the memory cell (unit cell) MC.

The operation (e.g., the operation described with reference to FIG. 8 and FIG. 9) which is substantially similar to the operation of changing the resistance state of the resistance change element 1 in the first embodiment can be applied to the operation of changing the resistance state of the resistance change element 1 as the memory element during the writing of data into the memory circuit 110C included in the FPGA according to the present embodiment, depending on the characteristics of the resistance change element. Therefore, this operation is not described here.

As described above, in the reconfigurable logic circuit 100C according to the third embodiment, the unit cells included in the memory cells are connected in series in the memory circuit, so that power consumption can be reduced as in the reconfigurable logic circuits according to the first and second embodiments.

(5) Modification

A modification of the reconfigurable logic circuit (e.g., FPGA) according to the embodiment is described with reference to FIG. 16.

FIG. 16 is a schematic diagram illustrating the circuit configuration of the reconfigurable logic circuit according to the present modification.

In the example shown according to the embodiment described above, the output terminal of the memory circuit is connected to the switch circuit via an SRAM cell.

As shown in FIG. 16, two memory circuits (memory blocks) $110_1$ and $110_2$ in the FPGA may be connected to one SRAM.

Transfer gates 55A and 55B are provided for the two memory circuits $110_1$ and $110_2$, respectively. The gates of the transfer gates 55A and 55B are connected to different read control lines 56A and 56B, and turned on or off at different timings.

An output terminal NDR of one memory circuit $110_1$ among the two memory circuits $110_1$ and $110_2$ connected to a common SRAM cell 5 is connected to the input node of an inverter INV2 in the SRAM cell 5 via the transfer gate 55A. An output terminal NDR of the other memory circuit $110_2$ is connected to the input node of an inverter INV1 in the SRAM cell 5 via the transfer gate 55B.

Switch circuits 9A and 9B are provided for the two memory circuits $110_1$ and $110_2$, respectively. The memory circuit $110_1$ is connected to the switch circuit 9A via the output node of the inverter INV2. The memory circuit $110_2$ is connected to the switch circuit 9B via the output node of the inverter INV1.

The SRAM cell 5 retains data from one of the two memory circuits $110_1$ and $110_2$ in accordance with the operation of the FPGA including the memory circuits $110_1$ and $110_2$.

Two memory circuits 110B included in the reconfigurable logic circuit according to the second embodiment may be connected to one SRAM cell, as in the connection relation between the two memory circuits $110_1$ and $110_2$ and one SRAM cell in FIG. 16.

One SRAM cell is shared by the two memory circuits $110_1$ and $110_2$ in the semiconductor integrated circuit (e.g., FPGA) according to the present modification. Thus, as compared to the case where one SRAM cell is provided for each memory circuit, the reconfigurable logic circuit (FPGA) including the memory circuit and the chip size of the LSI can be reduced, and the chip cost of the LSI can be reduced.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reconfigurable logic circuit device comprising:
a memory circuit including a first cell group which includes first unit cells connected in series, a second cell group which includes second unit cells connected in series, memory cells each including one of the first unit cells and one of the second unit cells, a first control circuit connected to the first unit cell at one end of the first cell group, a second control circuit connected to the second unit cell at one end of the second cell group, and an output terminal connected to the first unit cell at the other end of the first cell group and the second unit cell at the other end of the second cell group; and
a switch circuit which is connected to the output terminal and which is controlled by an output signal from the memory circuit,
wherein the first control circuit includes:
a first selection element including a first terminal electrically connected to the first unit cell at the one end of the first cell group, a second terminal electrically connected to a first power supply terminal and a first control terminal to which a first control signal is supplied,
a second selection element including a third terminal electrically connected to the first unit cell at the one end of the first cell group, a fourth terminal electrically connected to a second power supply terminal and a second control terminal to which a second control signal is supplied,
a third selection element including a fifth terminal electrically connected to the first unit cell at the one end of the first cell group, a sixth terminal electrically connected to a third power supply terminal and a third control terminal to which a third control signal is supplied, and
a fourth selection element including a seventh terminal electrically connected to the first unit cell at the one end of the first cell group, an eighth terminal electrically connected to a fourth power supply terminal and a fourth control terminal to which a fourth control signal is supplied;
the second control circuit includes:
a fifth selection element including a ninth terminal electrically connected to the second unit cell at the one end of the second cell group, a tenth terminal electrically connected to the first power supply terminal, and a fifth control terminal to which a fifth control signal is supplied, and
a sixth selection element including an eleventh terminal electrically connected to the second unit cell at the one end of the second cell group, a twelfth terminal electrically connected to the second power supply terminal, and a sixth control terminal to which a sixth control signal is supplied; and each of the first and second unit cells includes:
- a seventh selection element including a thirteenth terminal, a fourteenth terminal and a seventh control terminal to which a seventh control signal is input, and
- a memory element including a fifteenth terminal electrically connected to the thirteenth terminal and a sixteenth terminal electrically connected to the fourteenth terminal, resistance states of the memory element being associated with data to be stored.

2. The device according to claim 1, wherein
the first and second control circuits change the resistance states of the memory elements respectively included in the first and second unit cells in a selected memory cell among the memory cells to different resistance states when data is written into the selected memory cell.

3. The device according to claim 1, further comprising:
a select circuit which selects one first unit cell and one second unit cell in the selected memory cell among the first unit cells and the second unit cells.

4. The device according to claim 1, further comprising:
a flip-flop circuit connected between the output terminal and the switch circuit.

5. The device according to claim 1, further comprising:
an inverter circuit connected between the output terminal and the switch circuit.

6. The device according to claim 1, wherein
the resistance state of the memory element changes in accordance with the polarity of a voltage applied across the fifteenth and sixteenth terminals or the direction of a current flowing across the fifteenth and sixteenth terminals.

7. The device according to claim 1, wherein
the memory circuit is a configuration memory to store configuration information regarding a logic circuit which performs signal processing, and
the switch circuit controls the connection between logic elements on the basis of the configuration information, the logic elements connected to the current path of the switch circuit.

* * * * *